United States Patent
Kaushik et al.

(10) Patent No.: US 11,605,589 B2
(45) Date of Patent: Mar. 14, 2023

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Naveen Kaushik, Boise, ID (US); Sidhartha Gupta, Boise, ID (US); Pankaj Sharma, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 17/161,313

(22) Filed: Jan. 28, 2021

(65) Prior Publication Data
US 2022/0238431 A1    Jul. 28, 2022

(51) Int. Cl.
*H01L 23/522*    (2006.01)
*H01L 27/11582*    (2017.01)
(Continued)

(52) U.S. Cl.
CPC ............ *H01L 23/5226* (2013.01); *G11C 5/06* (2013.01); *H01L 21/486* (2013.01);
(Continued)

(58) Field of Classification Search
CPC ............... H01L 23/5226; H01L 21/486; H01L 21/76802; H01L 21/76877; H01L 27/11556; H01L 27/11582; G11C 5/06
See application file for complete search history.

(56) References Cited

U.S. PATENT DOCUMENTS 8,546,239 B2    10/2013    Harari et al.
8,778,749 B2    7/2014    Pachamuthu et al.
(Continued)

OTHER PUBLICATIONS

Clampitt et al., Microelectronic Devices Including Voids Neighboring Conductive Contacts, and Related Memory Devices, Electronic Systems, and Methods, filed Jan. 5, 2021, U.S. Appl. No. 17/141,722, 59 pages.
(Continued)

*Primary Examiner* — Karen Kusumakar
(74) *Attorney, Agent, or Firm* — TraskBritt

(57) ABSTRACT

A method of forming a microelectronic device comprises forming a stack structure comprising vertically alternating insulating structures and conductive structures arranged in tiers. Each of the tiers individually comprises one of the insulating structures and one of the conductive structures. A sacrificial material is formed over the stack structure and pillar structures are formed to extend vertically through the stack structure and the sacrificial material. The method comprises forming conductive plug structures within upper portions of the pillar structures, forming slots extending vertically through the stack structure and the sacrificial material, at least partially removing the sacrificial material to form openings horizontally interposed between the conductive plug structures, and forming a low-K dielectric material within the openings. Microelectronic devices, memory devices, and electronic systems are also described.

23 Claims, 6 Drawing Sheets

(51) Int. Cl.
  *G11C 5/06* (2006.01)
  *H01L 21/48* (2006.01)
  *H01L 21/768* (2006.01)
  *H01L 27/11556* (2017.01)

(52) U.S. Cl.
  CPC .. *H01L 21/76802* (2013.01); *H01L 21/76877* (2013.01); *H01L 27/11556* (2013.01); *H01L 27/11582* (2013.01)

(56) References Cited

U.S. PATENT DOCUMENTS

| | | | |
|---|---|---|---|
| 9,123,714 | B2 | 9/2015 | Pachamuthu et al. |
| 9,165,859 | B2 | 10/2015 | Lim et al. |
| 9,401,371 | B1 | 7/2016 | Lee et al. |
| 9,425,200 | B2 | 8/2016 | Hwang et al. |
| 9,449,982 | B2 | 9/2016 | Lu et al. |
| 9,698,097 | B2 | 7/2017 | Lee et al. |
| 9,786,598 | B2 | 10/2017 | Kim et al. |
| 9,899,399 | B2 | 2/2018 | Ogawa et al. |
| 10,050,054 | B2 | 8/2018 | Zhang et al. |
| 10,256,141 | B2 | 4/2019 | Chandhok et al. |
| 10,403,632 | B2 | 9/2019 | Ogawa et al. |
| 2013/0320550 | A1 | 12/2013 | Kim |
| 2014/0159135 | A1 | 6/2014 | Fujimoto et al. |
| 2016/0093635 | A1* | 3/2016 | Rabkin ............. H01L 21/76802 257/314 |
| 2016/0141337 | A1 | 5/2016 | Shimabukuro et al. |
| 2016/0276273 | A1 | 9/2016 | Kwon et al. |
| 2017/0040207 | A1 | 2/2017 | Purayath et al. |
| 2017/0076974 | A1 | 3/2017 | Choi et al. |

OTHER PUBLICATIONS

Jain et al., Memory Arrays and Methods Used in Forming a Memory Array, filed Jan. 15, 2020, U.S. Appl. No. 16/743,329, 46 pages.

Kaushik et al., Integrated Assemblies Having Conductive-Shield-Structures Between Linear-Conductive-Structures, filed Jul. 9, 2020, U.S. Appl. No. 16/924,506, 40 pages.

Vahdat et al., Memory Arrays and Methods Used in Forming a Memory Array, filed Feb. 18, 2020, U.S. Appl. No. 16/793,263, 47 pages.

* cited by examiner

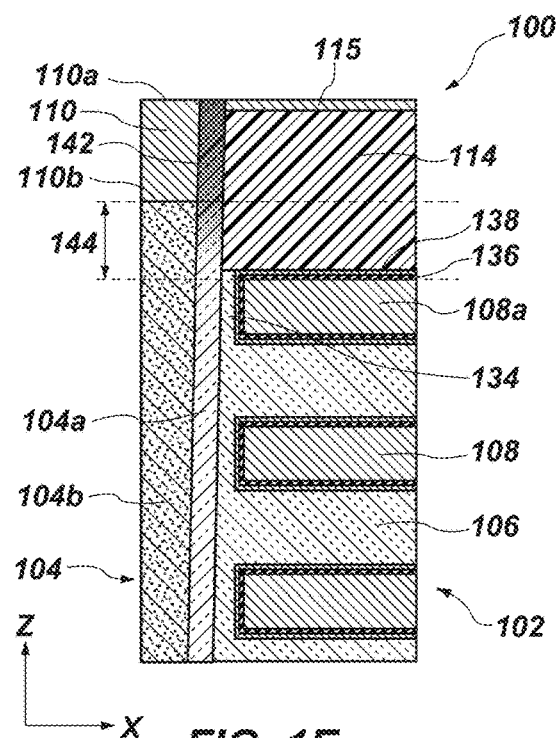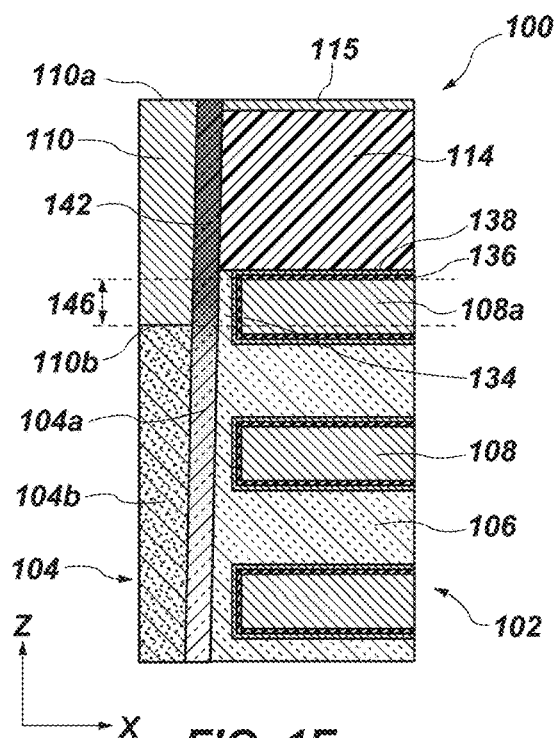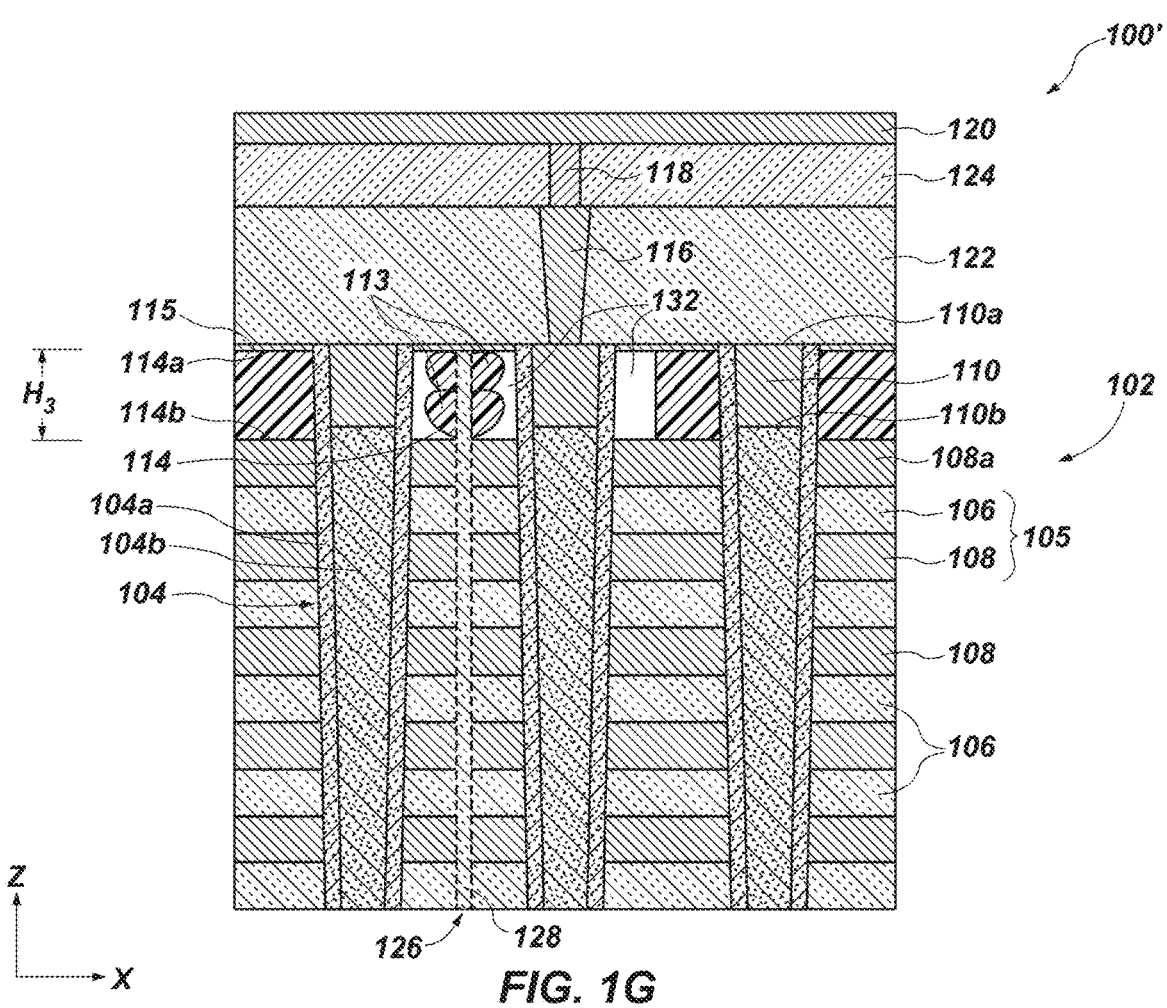

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

As the dimensions and spacing of the conductive features decrease, multilevel wiring structures have been used in memory devices (e.g., 3D NAND Flash memory devices) to electrically connect the conductive features to one another. The memory device includes the wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device.

BRIEF DESCRIPTION OF THE DRAWINGS

FIGS. 1A through 1G are simplified partial cross-sectional views illustrating a method of forming a microelectronic device, in accordance with embodiments of the disclosure;

DETAILED DESCRIPTION

Figure 1A:
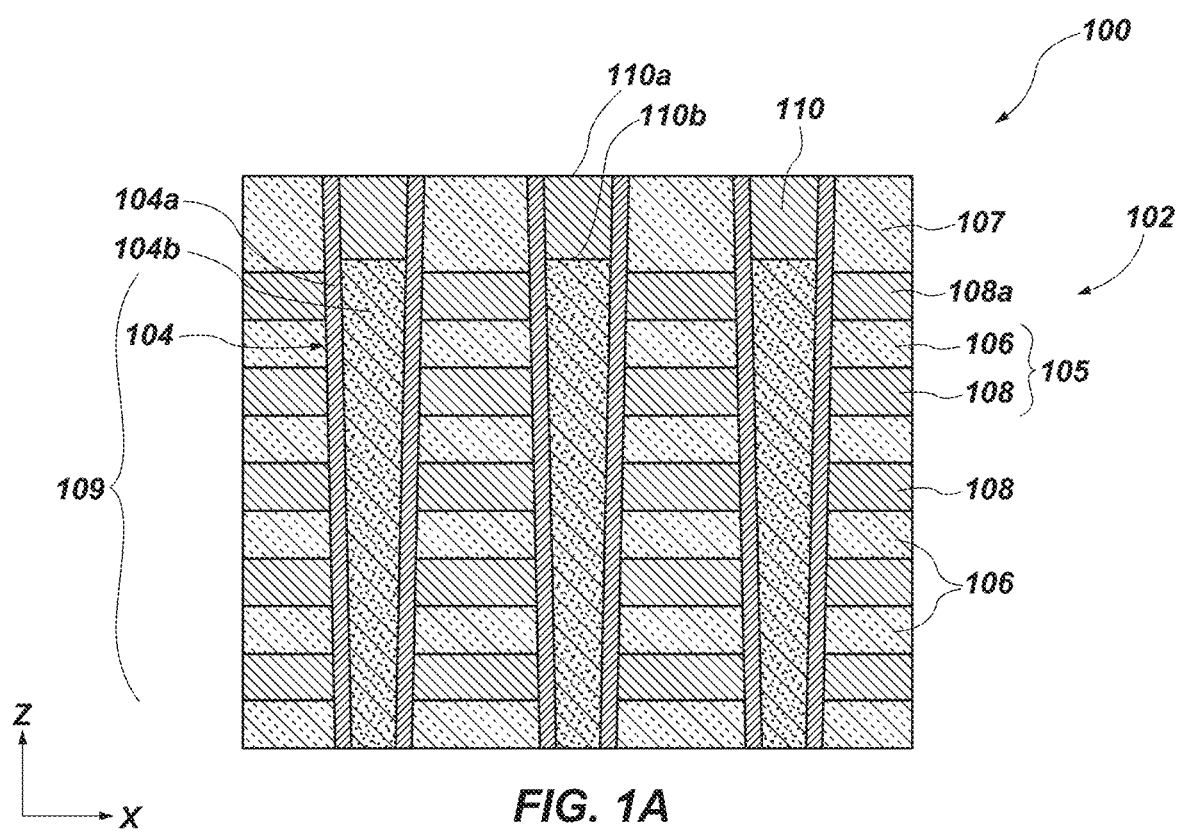

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper,"

"top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (e.g., neighboring) features.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

As used herein, the term "sacrificial," when used in reference to a material or structure, means and includes a material or structure that is formed during a fabrication process but which is removed (e.g., substantially removed) prior to completion of the fabrication process.

As used herein, the term "air gap" means a volume extending into or through another region or material, or between regions or materials, leaving a void in that other region or material, or between regions or materials, that is empty of a solid and/or liquid material. An "air gap" is not necessarily empty of a gaseous material (e.g., air, oxygen, nitrogen, argon, helium, or a combination thereof) and does not necessarily contain "air." An "air gap" may be, but is not necessarily, a void (e.g., an unfilled volume, a vacuum).

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "low-K dielectric material" means and includes a dielectric material, such as a dielectric nitride material or a dielectric oxide material, having a dielectric constant (K) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms. The dielectric constant of silicon dioxide is from about 3.7 to about 3.9 and the dielectric constant of silicon nitride is about 7.5. The term "low-K dielectric material" is a relative term and is distinguished from the term "dielectric material" by a relative value of its dielectric constant.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

FIGS. 1A through 1G illustrate a method of forming a microelectronic device structure for a microelectronic device (e.g., a memory device, such as a 3D NAND Flash memory device), in accordance with embodiments of the disclosure. Referring to FIG. 1A, a partially fabricated microelectronic device structure 100 to be employed to form an apparatus (e.g., a microelectronic device, a memory device) of the disclosure is shown. The partially fabricated microelectronic device structure 100 at the process stage shown in FIG. 1A may be formed by conventional techniques, which are not described in detail herein. The microelectronic device structure 100 includes a stack structure 102 including a vertically alternating sequence of a least two different materials. For example, the stack structure 102 may include a vertically alternating sequence of insulating structures 106 and conductive structures 108 arranged in tiers 105.

The insulating structures 106 of the stack structure 102 may be formed of and include at least one dielectric material. In some embodiments, the insulating structures 106 are formed of and include silicon dioxide ($SiO_2$). The insulating structures 106 may be formed using one or more conventional deposition techniques, including, but not limited to one or more of a conventional CVD process or a conventional ALD process. A sacrificial material 107 (e.g., an insulative material, an oxide material) may be located adjacent to (e.g., on or over) an uppermost conductive structure 108a of the conductive structures 108. The sacrificial material 107 may be formed during formation of the insulating structures 106 and may be substantially the same (e.g., exhibit substantially the same material composition) as the insulating structures 106.

The conductive structures 108 of the stack structure 102 may be formed of and include at least one conductive material. In some embodiments, the conductive structures 108 are formed of and include tungsten (W). In other embodiments, the conductive structures 108 are formed of and include conductively doped polysilicon. Each of the conductive structures 108 may individually include a substantially homogeneous distribution of the at least one conductive material, or a substantially heterogeneous distribution of the at least one conductive material. In some embodiments, each of the conductive structures 108 exhibits a substantially homogeneous distribution of conductive material. In additional embodiments, at least one of the conductive structures 108 exhibits a substantially heterogeneous distribution of at least one conductive material.

The conductive structures 108 of one or more (e.g., from one to five) vertically upper tiers 105 of the stack structure 102 may be employed as select gate structures 109 (e.g., drain side select gate (SGD) structures). In addition, the conductive structures 108 of one or more vertically lower tiers 105 of the stack structure 102 may be employed as additional select gate structures (e.g., source side select gate (SGS) structures). The conductive structures 108 of one or more remaining tiers 105 of the stack structure 102 may be employed as access line (e.g., word line) structures (e.g., access line plates, word line plates) of the microelectronic device structure 100. The conductive structures 108 may be formed in place of sacrificial materials (e.g., nitride materials) by a so-called "replacement gate" or "gate last" process. The microelectronic device structure 100 may alternatively be formed by a so-called "gate first" process in which the tiers 105 having alternating conductive structures 108 and insulating structures 106 are formed prior to forming additional structures, as described in greater detail below. For instance, the tiers 105 having alternating conductive structures 108 and insulating structures 106 are present in the microelectronic device structure 100 prior to formation of the additional structures.

As shown in FIG. 1A, pillar structures 104 may extend vertically through the stack structure 102. The pillar structures 104 may be formed in an array region of the microelectronic device structure 100 and may be configured as memory pillar structures (e.g., channel pillar structures, vertical structures). The pillar structures 104 may exhibit a substantially rectangular cross-sectional shape (e.g., a substantially square cross-sectional shape). However, the disclosure is not so limited. As a non-limiting example, in additional embodiments, the pillar structures 104 exhibit a substantially circular cross-sectional shape. In addition, a pitch between horizontally neighboring pillar structures 104 may be within a range of from about 50 nanometers (nm) to about 200 nm, such as from about 50 nm to about 100 nm, from about 100 nm to about 150 nm, or from about 150 nm to about 200 nm. In some embodiments, a critical dimension of the individual pillar structures 104 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example.

The pillar structures 104 may be formed in openings vertically extending (e.g., in the Z-direction) through the stack structure 102. For example, the pillar structures 104 may be formed in high aspect ratio (HAR) openings, such as openings individually having an aspect ratio of at least about 20:1, at least about 40:1, at least about 50:1, at least about 60:1, at least about 80:1, or at least about 100:1. In some embodiments, the openings of the pillar structures 104 have an aspect ratio within a range of from about 20:1 to about 40:1. Individual pillar structures 104 include a channel material of cell film 104a surrounding a fill material 104b. For example, the cell film 104a may include a cell material formed within the openings, and a channel material formed adjacent (e.g., over) the cell material. For convenience, the cell material and channel material are illustrated as a single material (e.g., the cell film 104a) in FIG. 1A. However, the cell film 104a is understood to include both the cell material and the channel material. In some embodiments, the channel material of cell film 104a comprises a liner having a thickness less than about 25 nm, such as within a range of from about 5 nm to about 20 nm. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed on or over sidewalls of the pillar structures 104. The cell material may be formed at a smaller relative thickness than the channel material. The channel material may be conformally formed adjacent (e.g., over) the cell material. The channel material may, for example, be polysilicon. The fill material 104b may be formed adjacent (e.g., over) the channel material of the cell films 104a, substantially filling the openings. The fill material 104b may be an insulative material, such as a silicon oxide material. For example, the fill material 104b may be a substantially uniform and conformal silicon oxide ($SiO_x$) material (e.g., a substantially uniform and conformal $SiO_2$ material). The fill material 104b may be substantially uniform and conformal as deposited. The fill material 104b may be formed by conventional techniques, such as by ALD. In some embodiments, the fill material 104b is an ALD $SiO_x$. The fill material 104b may initially be formed in the openings and over exposed horizontal surfaces of the stack structure 102, with the fill material 104b over the stack structure 102 subsequently removed, such as by an abrasive planarization process (e.g., chemical mechanical planarization (CMP)).

Accordingly, the fill material 104b is surrounded by the cell material and the channel material of the cell film 104a. In some embodiments, uppermost surfaces of remaining portions of the fill material 104b within the openings are below (e.g., vertically recessed from) an uppermost surface of the stack structure 102 and are above an upper surface of the uppermost conductive structure 108a, as described in further detail below with reference to FIG. 1E. In other embodiments, the uppermost surfaces of the fill material 104b within the openings are below the uppermost surface of the stack structure 102 and are below the upper surface of the uppermost conductive structure 108a, as described in further detail below with reference to FIG. 1F. At least portions of the pillar structures 104 may be operably coupled (e.g., electrically connected) to conductive structures (e.g., word line structures, a source structure underlying the stack structure 102), as described in further detail below with reference to FIG. 2.

Still referring to FIG. 1A, conductive plug structures 110 (e.g., drain contact plugs) may be formed within upper portions of the pillar structures 104. The conductive plug structures 110 may be formed on or over the fill material 104b and inwardly laterally adjacent to the channel material of the cell film 104a. Upper surfaces 110a of the conductive plug structures 110 may extend to and be substantially coplanar with an upper surface of the stack structure 102. Lower surfaces 110b of the conductive plug structures 110 may be adjacent to (e.g., directly vertically adjacent to) upper surfaces of the fill material 104b of the pillar structures 104. The conductive plug structures 110 may be electrically coupled to the channel material of the cell film 104a. In some embodiments, the upper surfaces 110a of the conductive plug structures 110 are substantially coplanar with upper surfaces of the channel material of cell film 104a. The conductive plug structures 110 may comprise a semiconductor material, such as one or more of polysilicon, silicon germanium, and germanium. The conductive plug structures 110 may be conductively doped, as described in greater detail with reference to FIGS. 1E and 1F. The process for forming the conductive plug structures 110 may be, for example, CVD or ALD.

Figure 1B:
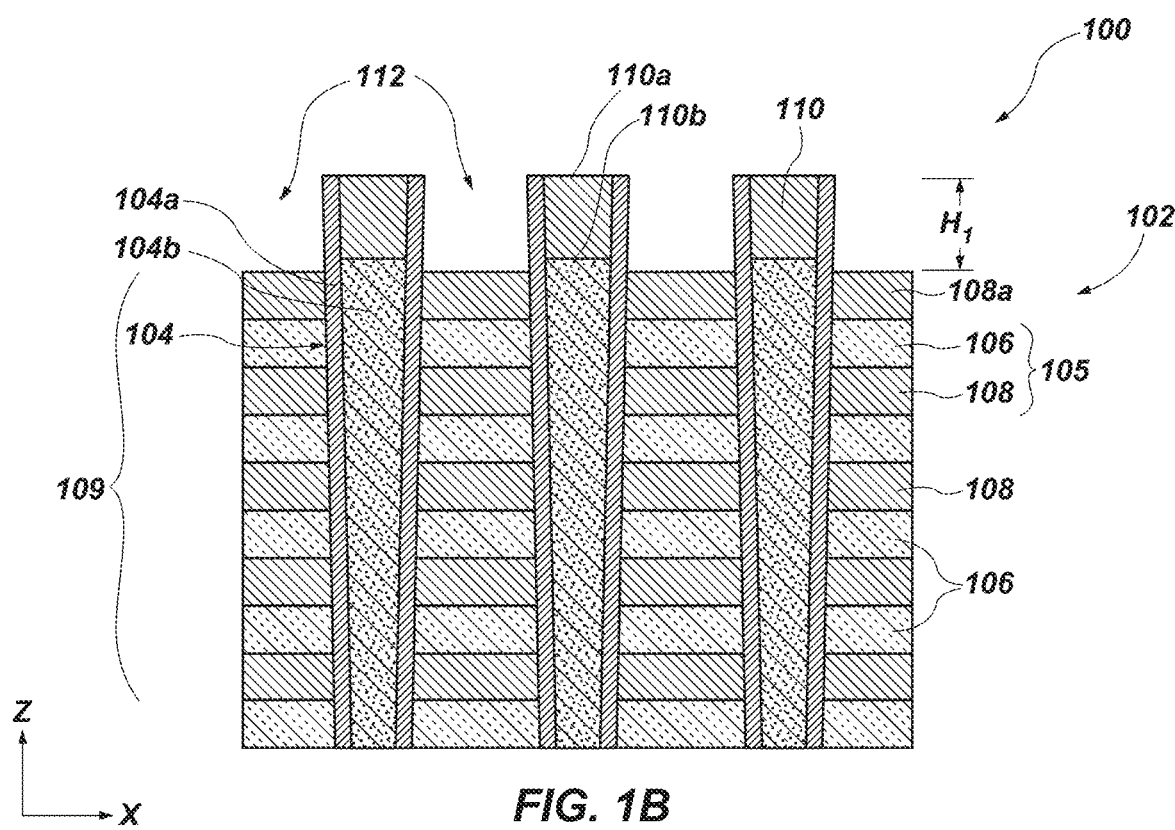

With reference to FIG. 1B, the microelectronic device structure 100 may be patterned to form openings 112 interposed between horizontally neighboring pillar structures 104 in a first direction (e.g., the X-direction) and having elongated portions extending in a second direction (e.g., the Y-direction). The openings 112 may be formed by at least partially removing the sacrificial material 107 (FIG. 1A). At least portions of the sacrificial material 107 are removed by exposing the sacrificial material 107 to wet etch and/or dry etch chemistries, for example, in one or more material removal processes. The microelectronic device structure 100 may be exposed to one or more etchants using conventional processes (e.g., spin-coating process, a spray-coating process, an immersion-coating process, a vapor-coating process, a soaking process, combinations thereof) and conventional processing equipment, which are not described in detail herein. The sacrificial material 107 may be formed during formation of the stack structure 102 and may include a material composition that is substantially the same as a material composition of the underlying insulating structures 106. However, the disclosure is not so limited, and additional process acts may be contemplated. For example, regions designated for the openings 112 between the horizontally neighboring pillar structures 104 may be filled with the sacrificial material 107 including a material composition that is different than the material composition of the underlying insulating structures 106. Alternatively, the regions designated for the openings 112 may remain substantially unfilled during formation of the stack structure 102.

A total depth of the openings 112 may substantially correspond to a height of the sacrificial material 107 (FIG. 1A). For example, the openings 112 may be formed to have a desired depth that may be selected at least partially based on an initial height of the sacrificial material 107 (e.g., a height of the pillar structures 104 extending above upper surface of the uppermost conductive structure 108a) and on a desired height of insulative structures (e.g., a low-K dielectric material, air gaps) to be formed through subsequent processing of the microelectronic device structure 100, as described in further detail below with reference to FIGS. 1C and 1G. The openings 112 may be formed to have a desired height $H_1$. The height $H_1$ of the openings 112 may be selected at least partially based on a desired height of a low-K dielectric material to subsequently be formed therein. By way of non-limiting example, the height $H_1$ of the openings 112 and, thus, the low-K dielectric material to subsequently be formed therein, may be within a range of from about 20 nm to about 60 nm, such as from about 20 nm to about 30 nm, from about 30 nm to about 40 nm, from about 40 nm to about 50 nm, or from about 50 nm to about 60 nm.

In some embodiments, the sacrificial material 107 is removed (e.g., substantially entirely removed) such that the microelectronic device structure 100 is substantially devoid (e.g., substantially absent) of the sacrificial material 107. Accordingly, the openings 112 may be partially defined by outer side surfaces of the pillar structures 104 and the upper surface of the uppermost conductive structure 108a of the stack structure 102. In additional embodiments, portions of the sacrificial material 107 are selectively removed (e.g., etched) without entirely removing the sacrificial material 107 above the uppermost conductive structure 108a and between the pillar structures 104. The openings 112 may facilitate the subsequent formation of the insulative structures laterally adjacent to the conductive plug structures 110 of the pillar structures 104, as described in further detail below.

Figure 1C:
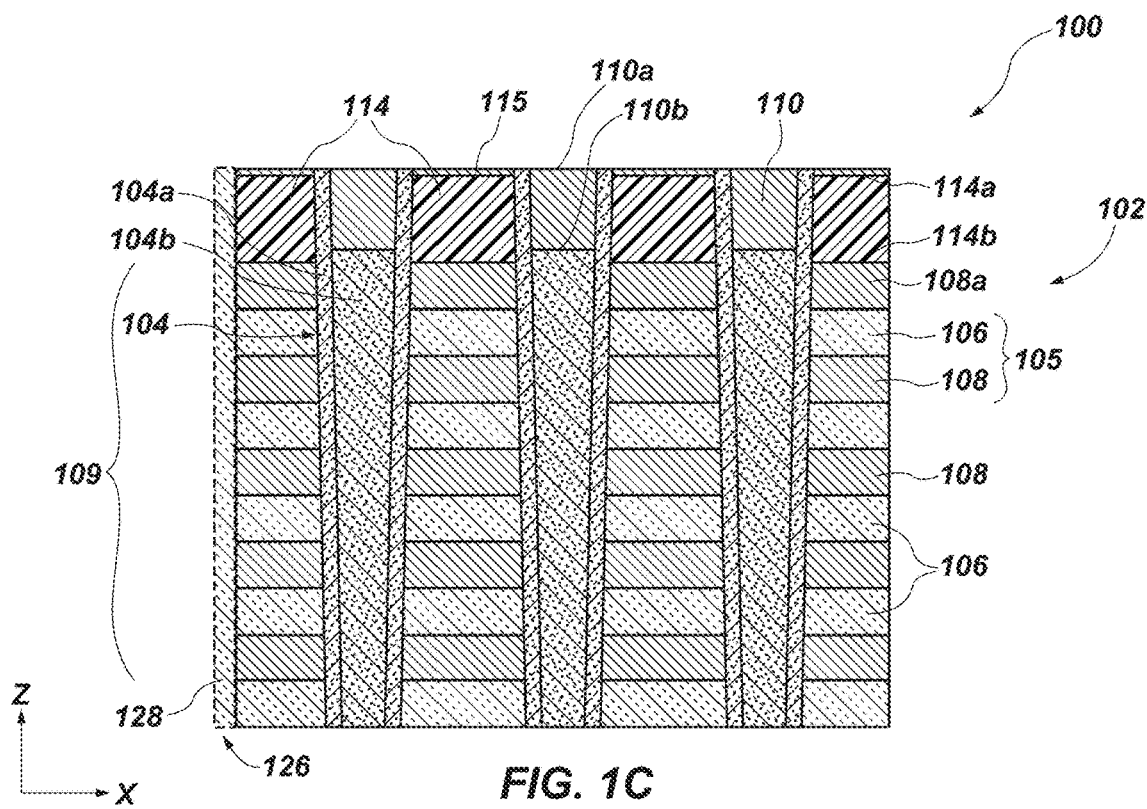

With reference to FIG. 1C, a low-K dielectric material 114 having upper surfaces 114a and lower surfaces 114b may be formed within the openings 112 (FIG. 1B). The upper surfaces 114a of the low-K dielectric material 114 may be substantially coplanar with the upper surfaces 110a of the conductive plug structures 110. Accordingly, the upper surfaces 114a of the low-K dielectric material 114 may be substantially coplanar with upper surfaces of the channel material of cell film 104a of the pillar structures 104. The lower surfaces 114b of the low-K dielectric material 114 may be adjacent (e.g., on or over) the upper surface of the uppermost conductive structure 108a. The low-K dielectric material 114 may extend laterally adjacent to (e.g., between) horizontally neighboring conductive plug structures 110 of the pillar structures 104. In other words, the low-K dielectric material 114 may laterally intervene between and separate the horizontally neighboring conductive plug structures 110 from one another. Accordingly, the pillar structures 104 may be substantially (e.g., entirely) surrounded by the low-K dielectric material 114 at an elevational level of the conductive plug structures 110.

The low-K dielectric material 114 may be formed on or over the upper surface of the uppermost conductive structure 108a and on or over side surfaces (e.g., sidewalls) of the pillar structures 104. The low-K dielectric material 114 may be formed of and include at least one dielectric material having a lower dielectric constant (K) than $Si_3N_4$. By way of non-limiting example, the low-K dielectric material 114 may comprise one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_yN_z$). In some embodiments, the low-K dielectric material 114 comprises $SiO_xC_yN_z$. In additional embodiments, a different dielectric material (e.g., an oxide material, such as a dielectric oxide material, having a dielectric constant lower than the dielectric constant of a silicon oxide ($SiO_x$, $SiO_2$) material or of a carbon-doped silicon oxide material that includes silicon atoms, carbon atoms, oxygen atoms, and hydrogen atoms) may be employed as the low-K dielectric material 114. In some instances, the low-K dielectric material 114 may function as an insulator having a dielectric constant (K) within a range of from about 1.9 to about 3.2, such as within a range of from about 1.9 to about 2.7, from about 2.7 to about 3.0, or from about 3.0 to about 3.2. In some embodiments, the dielectric constant (K) of the low-K dielectric material 114 is about 3.0.

In addition, the low-K dielectric material 114 may be formed to any desired thickness (e.g., vertical dimension in the Z-direction), such as a thickness less than or equal to about 60 nm, such as within a range of from about 20 nm to about 30 nm, from about 30 nm to about 40 nm, from about 40 nm to about 50 nm, or from about 50 nm to about 60 nm. The low-K dielectric material 114 may facilitate improved electrical properties (e.g., decreased parasitic capacitance) relative to the insulative material (e.g., an oxide material having a relatively higher dielectric constant) of the insulating structures 106 of the stack structure 102 to better protect the conductive material (e.g., metal) of at least the uppermost conductive structure 108a during use and operation of the microelectronic device structure 100.

Still referring to FIG. 1C, a cap material 115 (e.g., a nitride material, nitride structures) may be formed on or over the low-K dielectric material 114. In some embodiments, the upper surfaces 114a of the low-K dielectric material 114 are substantially coplanar with upper surfaces of the pillar structures 104 and upper surfaces of the cap material 115 are located above a plane of upper surfaces of the pillar structures 104. In other embodiments, the upper surfaces 114a of the low-K dielectric material 114 are located vertically below the upper surfaces of the pillar structures 104 and the upper surfaces of the cap material 115 are substantially coplanar with the upper surfaces of the pillar structures 104, including upper surfaces of the channel material of cell film 104a of the pillar structures 104 and the upper surfaces 110a of the conductive plug structures 110. In yet other embodiments, another portion of the cap material 115 may be formed on or over the upper surface of the uppermost conductive structure 108a prior to formation of the low-K dielectric material 114, such that portions of the cap material 115 are located between the uppermost conductive structure 108a and the low-K dielectric material 114.

The cap material 115 may be formed of and include at least one dielectric material. For example, the cap material 115 may comprise a nitride material (e.g., $SiN_y$, $SiO_xN_y$) such as an etch stop material located over the upper surfaces 114a of the low-K dielectric material 114. The cap material 115 may be characterized as a so-called "nitride stop-etch" material, which material includes a material composition that is different than a material composition of the insulating structures 106 of the tiers 105 and different than a material composition of the low-K dielectric material 114, so that the cap material 115 is selectively removable relative to one or more of the insulating structures 106, the low-K dielectric material 114, and the sacrificial material 107 (FIG. 1A). The cap material 115 may be formed at a sufficient thickness to protect the low-K dielectric material 114 and/or additional materials of the stack structure 102 from subsequent process acts that may damage the materials of the stack structure 102 if the materials were to remain exposed during the subsequent process acts. The cap material 115 may also provide protection during use and operation of the microelectronic device structure 100, such as providing decreased parasitic capacitance between the conductive plug structures 110 and the uppermost conductive structure 108*a*. By way of non-limiting example, a thickness of the cap material 115 may be within a range of from about 3 nm to about 10 nm, such as within a range of from about 3 nm to about 5 nm, from about 5 nm to about 7 nm, or from about 7 nm to about 10 nm.

In some embodiments, the cap material 115 is formed on or over (e.g., directly vertically adjacent to) the upper surfaces 114*a* of the low-K dielectric material 114 following formation of the low-K dielectric material 114 within the openings 112. In other embodiments, the cap material 115 is formed on or over (e.g., directly vertically adjacent to) the sacrificial material 107 (FIG. 1A) prior to formation of the low-K dielectric material 114 within the openings 112. For example, the cap material 115 is formed (e.g., conformally formed, non-conformally formed) over exposed surfaces of the sacrificial material 107. Thereafter, the sacrificial material 107 of the stack structure 102 may be at least partially (e.g., substantially) removed through slots 126 that vertically extend completely through the stack structure 102. The low-K dielectric material 114 may be formed within the openings 112 through the slots 126 following formation of the cap material 115. Further, the low-K dielectric material 114 may be formed prior to or following a so-called "replacement gate" process that employs the slots 126 to replace initial sacrificial structure (e.g., dielectric nitride structures) with the conductive structures 108. An insulative material 128 may be formed in and may fill the slots 126 following formation of the low-K dielectric material 114 and the conductive structures 108 to form filled slot structures. A material composition of the insulative material 128 may be substantially the same as or different than a material composition of the low-K dielectric material 114. In some embodiments, the material composition of the insulative material 128 is formed of and includes SiO$_2$. Accordingly, the material composition of the insulative material 128 may be substantially the same as a material composition of the insulating structures 106 of the stack structure 102 and may be different than a material composition of the low-K dielectric material 114.

Figure 1D:
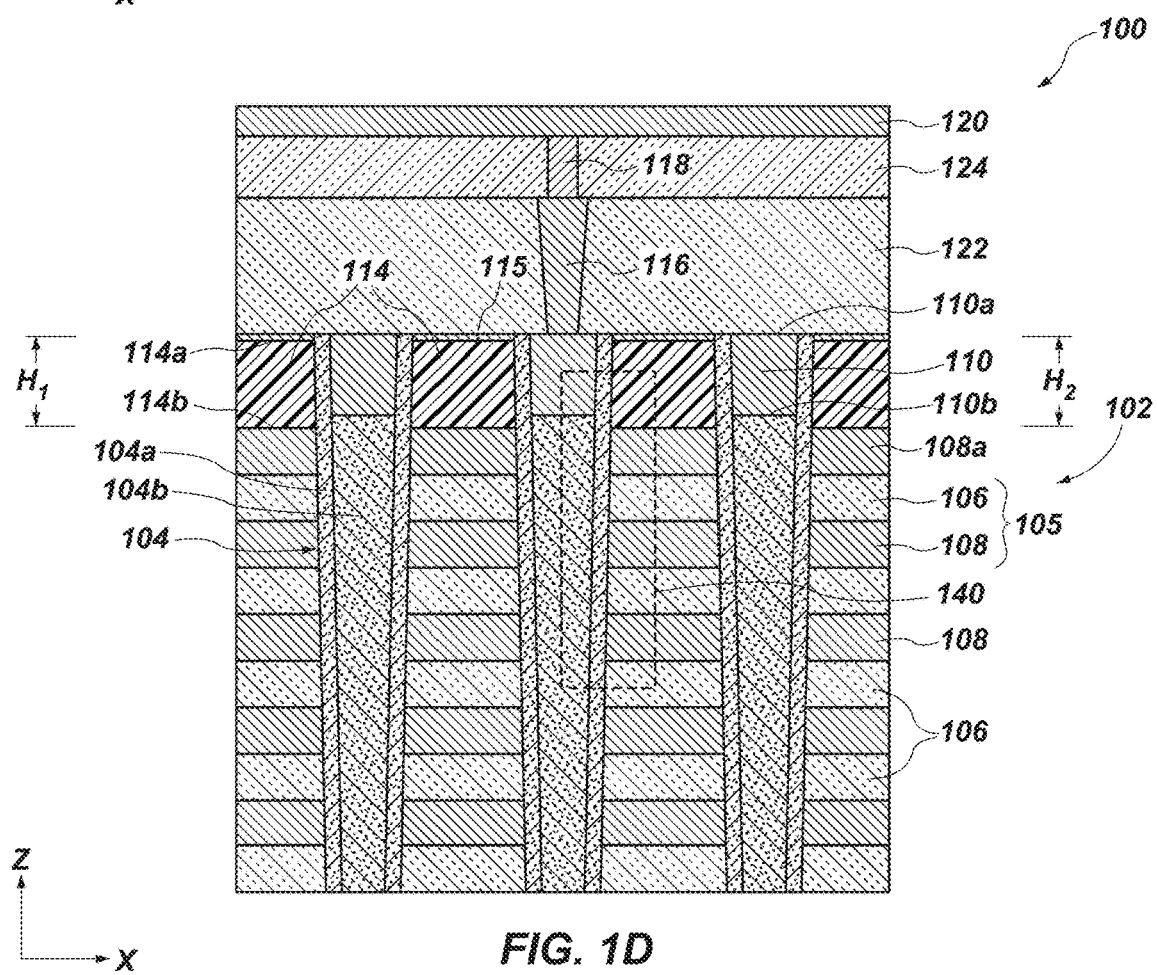

With reference to FIG. 1D, contact structures 116 (e.g., contacts, bit line contacts) may be formed on or over uppermost surfaces of the conductive plug structures 110. The contact structures 116 may each include outer side surfaces, upper surfaces, and lower surfaces on or over (e.g., directly vertically adjacent to) the upper surfaces 110*a* of the conductive plug structures 110. The contact structures 116 may be formed using one or more conventional processes (e.g., conventional deposition processes, conventional material removal processes) and conventional processing equipment, which are not described in detail herein. For example, portions of a first dielectric material 122 overlying the conductive plug structures 110 may be removed (e.g., through a conventional photolithographic patterning and etching process) to form a plug opening overlying the conductive plug structures 110, a conductive material may be deposited into the plug opening, and the portions of the conductive material may be removed (e.g., through a CMP process) to form the contact structures 116. The contact structures 116 may be formed of and include at least one conductive material. In some embodiments, the contact structures 116 are formed of and includes W.

Outer side surfaces (e.g., sidewalls) of the contact structures 116 may exhibit a tapered profile with an upper portion of individual contact structures 116 having a greater critical dimension (e.g., width) than a lower portion thereof, as shown in FIG. 1D. In other embodiments, the contact structures 116 have a different profile, for example, a substantially rectangular profile, a dish-shaped profile, or any other three-dimensional recess shape, such that portions (e.g., a lateral extent of the upper surfaces) of the contact structures 116 extend beyond sidewalls of the pillar structures 104 in at least one lateral direction (e.g., the X-direction). An additional portion of dielectric material, a second dielectric material 124, may be formed on or over the upper surfaces of the contact structures 116.

The first dielectric material 122 and the second dielectric material 124 may individually be formed of and include at least one dielectric material. In some embodiments, one or more of the first dielectric material 122 and the second dielectric material 124 is formed of and includes SiO$_2$. The first dielectric material 122 and the second dielectric material 124 may or may not include substantially the same material composition as one another and as the insulating structures 106 of the stack structure 102. In other embodiments, one or more of the first dielectric material 122 and the second dielectric material 124 is formed of and includes a low-K dielectric material (e.g., an additional portion of the low-K dielectric material 114).

The first dielectric material 122 and the second dielectric material 124 may be formed using one or more conventional processes (e.g., conventional deposition processes, such as one or more of spin-on coating, blanket coating, CVD and PVD; conventional material removal processes, such as a conventional CMP process) and conventional processing equipment, which are not described in detail herein. For example, first dielectric material 122 may be formed on or over portions of the upper surfaces 114*a* of the low-K dielectric material 114 and the second dielectric material 124 may be formed on or over portions of the first dielectric material 122 using one or more conventional non-conformal deposition processes (e.g., at least one conventional non-conformal PVD process). Following formation, one or more of the first dielectric material 122 and the second dielectric material 124 may be subjected to at least one conventional planarization process (e.g., at least one conventional CMP process) to facilitate or enhance the planarity of an upper boundary (e.g., upper surface) thereof.

Interconnect structures 118 (e.g., filled contact vias, filled bit line vias) may be formed on or over the upper surfaces of the contact structures 116. The interconnect structures 118 may each include outer side surfaces, upper surfaces, and lower surfaces adjacent to (e.g., directly vertically adjacent to) the upper surfaces of the contact structures 116. The interconnect structures 118 may be formed using one or more conventional processes (e.g., conventional deposition processes, conventional material removal processes) and conventional processing equipment, which are not described in detail herein. For example, portions of the second dielectric material 124 overlying the contact structures 116 may be removed (e.g., through a conventional photolithographic patterning and etching process) to form openings (e.g., vias, apertures) overlying the upper surfaces of the contact structures 116, a conductive material may be deposited into the openings, and the portions of the conductive material may be removed (e.g., through a CMP process) to form the interconnect structures 118.

The interconnect structures 118 may be formed through a damascene process without using one or more subtractive patterning (e.g., etching) processes. In some embodiments, the interconnect structures 118 are formed using a single damascene process, in which portions of the second dielectric material 124 may be selectively removed to expose respective portions of the upper surfaces of the contact structures 116 and to form the openings extending through the second dielectric material 124. The openings are partially defined by sidewalls of the second dielectric material 124 and may be formed by conventional photolithography techniques. One or more dry etch processes may be used to form the openings. The conductive material of the interconnect structures 118 may be formed within the openings using chemical vapor deposition (CVD) or physical vapor deposition (PVD), for example. The interconnect structures 118 may, alternatively, or additionally, be formed using selective CVD deposition using conventional techniques. Thereafter, upper portions of the conductive material above an upper surface of the second dielectric material 124 may be removed (e.g., by CMP processing) to form the interconnect structures 118.

In additional embodiments, the interconnect structures 118 are formed during formation of the contact structures 116. For example, the interconnect structures 118 may be formed substantially simultaneously with the formation of the contact structures 116 in order to simplify manufacturing processes. In other words, a conductive material of each of the contact structures 116 and the interconnect structures 118 may be deposited to substantially fill extended openings in the first dielectric material 122 and the second dielectric material 124 in a single deposition act. In such embodiments, outer side surfaces (e.g., sidewalls) of the interconnect structures 118 are initially formed to exhibit a tapered profile with an upper portion of individual interconnect structures 118 having a greater critical dimension (e.g., width) than a lower portion thereof and/or having a greater critical dimension (e.g., width) than the contact structures 116. For instance, the interconnect structures 118 may initially be formed to exhibit a lateral extent greater than a lateral extent of the contact structures 116. Portions of the outer side surfaces of the initial material of the interconnect structures 118 may be removed (e.g., etched) in one or more material removal processes such that a final dimension (e.g., final width) of the interconnect structures 118 is relatively less than that of the contact structures 116. The interconnect structures 118 may be formed of and include at least one conductive material. In some embodiments, the interconnect structures 118 are formed of and includes W. The interconnect structures 118 may or may not include substantially the same material composition as the contact structures 116.

The interconnect structures 118 may be positioned vertically over and within horizontal boundaries of the contact structures 116. In some embodiments, at least a portion of the outer side surfaces of each of the interconnect structures 118 and the contact structures 116 are aligned with one another. In other words, the outer side surfaces of each of the interconnect structures 118 and the contact structures 116 may be elongated, continuous portions of a conductive material along at least one side thereof. In additional embodiments, the interconnect structures 118 are not aligned with the contact structures 116, such that the side surfaces of the interconnect structures 118 and the contact structures 116 are not aligned with one another along any side thereof. The interconnect structures 118 may be laterally offset (e.g., positioned off-center or staggered) in order to facilitate electrical connection with the contact structures 116. In other words, a vertical centerline of the interconnect structures 118 is positioned off-center from a vertical centerline of the contact structures 116.

Conductive lines 120 (e.g., data lines, bit lines, digit lines) may be formed on or over upper surfaces of the second dielectric material 124 and exposed upper surfaces of the interconnect structures 118. The conductive lines 120 may be formed using one or more conventional deposition processes, such as one or more of a conventional ALD process, a conventional CVD process, and a conventional PVD process. In some embodiments, portions of the second dielectric material 124 overlying the interconnect structures 118 are removed (e.g., through a conventional photolithographic patterning and etching process) to form a plug opening overlying the interconnect structures 118; a conductive material may be deposited into the plug opening; and the portions of the conductive material may be removed (e.g., through a CMP process) to form the conductive lines 120. The conductive lines 120 may laterally extend perpendicular to the conductive structures 108 of the stack structure 102. In some embodiments, a nitride material (e.g., an etch stop material) is formed between the conductive lines 120 and the second dielectric material 124 (e.g., an oxide material). Such nitride materials may be located adjacent to the interconnect structures 118 and may be characterized as so-called "nitride stop-etch" materials, which materials include a material composition that is different than a material composition of the second dielectric material 124.

In other embodiments, the conductive material of the conductive lines 120 is formed to exhibit a substantially continuous, flat material surface over upper surfaces of the second dielectric material 124 and over the upper surfaces of the interconnect structures 118. In other words, the conductive material of the conductive lines 120 may initially be formed as a substantially continuous portion of material, without separation and without being formed in openings (e.g., trenches) in the second dielectric material 124. The conductive material may be substantially planar, and may exhibit a desired thickness of subsequently formed conductive lines 120 through one or more subtractive patterning processes. By initially forming the conductive lines 120 as a continuous portion of the conductive material, the subsequently formed conductive lines 120 may be formed without using one or more damascene processes, such as a single-damascene process or a dual-damascene process. In some such embodiments, the conductive lines 120 are formed adjacent to the second dielectric material 124 without being adjacent a nitride material. The conductive lines 120 may be formed of and include a conductive material. In some embodiments, the conductive lines 120 comprise W. The conductive lines 120 may or may not include substantially the same material composition as the interconnect structures 118 and/or the contact structures 116.

The conductive structures 108 of the tiers 105 may be operably coupled to electrically conductive structures, such as to the conductive plug structures 110. In some embodiments, vertically neighboring conductive structures 108 of the one or more vertically uppermost tier 105 of the stack structure 102 laterally adjacent to the pillar structures 104 function as the select gate structures 109 of the microelectronic device structure 100, as discussed in greater detail above with reference to FIG. 1A. In other embodiments, the stack structure 102 includes a lower portion including the conductive structures 108 laterally adjacent to the pillar structures 104 and an upper portion including the conductive structures 108 laterally adjacent to additional contact structures located between the contact structures 116 and the conductive plug structures 110 of the pillar structures 104 and separated from the lower portion of the stack structure 102 by another material (e.g., a barrier material). According, the conductive structures 108 within the upper portion may function as the select gate structures 109 (e.g., de-integrated SGDs).

Individual pillar structures 104, along with corresponding individual contact structures 116 and individual interconnect structures 118, are associated with a single (e.g., only one) of the conductive lines 120. For clarity and ease of understanding the drawings and associated description, some of the contact structures 116 and interconnect structures 118, are absent in FIG. 1D. In addition, each of three (3) additional pillar structures 104 of each set of four (4) of the pillar structures 104 is positioned half a pitch deeper into the plane of the page from the perspective of FIG. 1D (e.g., in the Y-direction) and is associated with three (3) of the conductive lines 120 of each set of four (4) of the conductive lines 120. However, the disclosure is not so limited, and additional configurations of the pillar structures 104, the contact structures 116, the interconnect structures 118, and the conductive lines 120 may be contemplated.

The conductive plug structures 110 may be formed to have a desired height $H_2$. The height $H_2$ of the conductive plug structures 110 may be selected at least partially based on a desired vertical offset (e.g., in the Z-direction) between the conductive plug structures 110 and the uppermost conductive structure 108*a*, as described in greater detail below with reference to FIGS. 1E and 1F. By way of non-limiting example, the height $H_2$ of the conductive plug structures 110 may be within a range of from about range of from about 20 nm to about 60 nm, such as from about 20 nm to about 30 nm, from about 30 nm to about 40 nm, from about 40 nm to about 50 nm, or from about 50 nm to about 60 nm. In some embodiments, the height $H_2$ of the conductive plug structures 110 is substantially equal to the height $H_1$ of the low-K dielectric material 114. In other embodiments, the height $H_1$ of the low-K dielectric material 114 may be relatively larger than the height $H_2$ of the conductive plug structures 110, as shown in FIG. 1D. In yet other embodiments, the height $H_1$ of the low-K dielectric material 114 may be relatively smaller than the height $H_2$ of the conductive plug structures 110, such that at least a portion of the conductive plug structures 110 overlaps the uppermost conductive structure 108*a*. In addition, the height $H_1$ of the low-K dielectric material 114 may be relatively larger than a height of the uppermost conductive structure 108*a* and relative larger than a combined height of the insulating structures 106 and the uppermost conductive structure 108*a* of one of the tiers 105. The relative heights of the materials may be tailored to have a desired value between the height $H_1$ of the low-K dielectric material 114 and the height $H_2$ of the conductive plug structures 110 that may be selected at least partially based on design requirements of the microelectronic device structure 100.

FIGS. 1E and 1F individually illustrate an enlarged portion of box 140 of FIG. 1D and illustrate a portion of the pillar structures 104 adjacent to the uppermost conductive structure 108*a* of the stack structure 102, in accordance with embodiments of the disclosure. The pillar structures 104 include the channel material of cell film 104*a* and the fill material 104*b*. The conductive plug structures 110 (e.g., a drain contact plug material) having upper surfaces 110*a* and lower surfaces 110*b* are located within upper portions of the pillar structures 104, as discussed with reference to FIG. 1A. The pillar structures 104 include an oxide material 134 (e.g., a block oxide) between the channel material of cell film 104*a* and the conductive structures 108. The oxide material 134 may include, for example, the outermost oxide material of the oxide-nitride-oxide (ONO) material of the pillar structures 104, as described in greater detail above. The stack structure 102 includes the insulating structures 106 and the conductive structures 108, including the uppermost conductive structure 108*a*. The low-K dielectric material 114 is located on or over the uppermost conductive structure 108*a* and the cap material 115 is located on or over the low-K dielectric material 114.

A liner material 136 (e.g., a conductive liner material) is located adjacent to the conductive structures 108 between vertically neighboring portions of the insulating structures 106. The liner material 136 may be formed of and include, for example, a metal (e.g., titanium, tantalum), a metal nitride (e.g., tungsten nitride, titanium nitride, tantalum nitride), or another material. In some embodiments, the liner material 136 comprises titanium nitride.

In some embodiments, a high-k dielectric material 138 is present between the liner material 136 and the insulating structures 106. The high-k dielectric material 138 may, for example, be formed of and include aluminum oxide, hafnium oxide, zirconium oxide, tantalum oxide, a combination thereof, or a combination of silicon oxide and one or more of the listed materials. In some embodiments, the high-k dielectric material 138 is formed of and include hafnium-doped silicon dioxide, where the ratio of hafnium to silicon is controlled to achieve a desired etch selectivity of the high-k dielectric material 138. The high-k dielectric material 138 may be selected to exhibit high etch selectivity relative to the insulating structures 106 of the tiers 105 (FIG. 1A). In other embodiments, the high-k dielectric material 138 is absent from the stack structure 102 and the liner material 136 is immediately adjacent to (e.g., in direct physical contact with) each of the conductive structures 108 and the insulating structures 106. Accordingly, the low-K dielectric material 114 is immediately adjacent to the high-k dielectric material 138, if present, or to the liner material 136 of the uppermost conductive structure 108*a*.

The uppermost conductive structure 108*a* may have a height that is greater than respective heights of the other conductive structures 108 of the stack structure 102. The relatively greater height of the uppermost conductive structure 108*a* may facilitate a relatively larger error margin when forming an extent of the conductive plug structures 110 relative to the uppermost conductive structure 108*a*. In other embodiments, the height of the uppermost conductive structure 108*a* is substantially the same as the respective heights the other conductive structures 108. By way of example and not limitation, the respective heights of the conductive structures 108, including the uppermost conductive structure 108*a*, may be within a range of from about 20 nm to about 50 nm.

The channel material of cell film 104*a* of the pillar structures 104 may be undoped, or may include a p-type dopant or an n-type dopant. The conductive plug structures 110 may also be doped with at least one dopant. As a non-limiting example, at least one n-type dopant, such as one or more of phosphorus, arsenic, antimony, and bismuth, may be implanted into the conductive plug structures 110. As another non-limiting example, at least one p-type dopant, such as one or more of boron, aluminum, and gallium, may be implanted into the conductive plug structures 110. By way of non-limiting example, the conductive plug structures 110 may include a first concentration of an n-type dopant and the channel material of cell film 104a may include a second concentration of an n-type dopant that is relatively lower than the first concentration. Since an upper portion of the channel material of cell film 104a is laterally adjacent (e.g., in direct physical contact) with the conductive plug structures 110, the dopant of the conductive plug structures 110 may be dispersed within a region 142 of the channel material of cell film 104a. Accordingly, the region 142 may contain a differing concentration (e.g., a relatively higher concentration) of a dopant compared to a doped region or, alternatively, to an undoped region of lower portions of the channel material of cell film 104a.

With reference to FIG. 1E, the conductive plug structures 110 may be located within the upper portions of the pillar structures 104 without being laterally adjacent to the uppermost conductive structure 108a, such that the conductive plug structures 110 include a so-called "negative offset" relative to the uppermost conductive structure 108a. As shown in FIG. 1E, an underlap region 144 is defined on an upper end by a plane of the lower surfaces 110b of the conductive plug structures 110 and on a lower end by a plane of an upper surface of the uppermost conductive structure 108a. The uppermost conductive structure 108a is laterally adjacent to the fill material 104b of the pillar structures 104 without being laterally adjacent to the conductive plug structures 110, in the embodiment of FIG. 1E. In other words, an entirety of the individual conductive plug structures 110 is located above the plane of the upper surface of the uppermost conductive structure 108a. Accordingly, the region 142 of the channel material of cell film 104a containing a differing concentration of a dopant is at least partially (e.g., substantially) above a plane of the upper surface of the uppermost conductive structure 108a. By way of non-limiting example, a height of the underlap region 144 may be within a range of from about 0 nm and about 50 nm, such between about 0 nm and about 10 nm, between about 10 nm and about 20 nm, between about 20 nm and about 30 nm, between about 30 nm and about 40 nm, or between about 40 nm and about 50 nm. In some embodiments, the height of the underlap region 144 is about 20 nm.

When the underlap region 144 is substantially equal to 0 nm (e.g., no overlap), the lower surfaces 110b of the conductive plug structures 110 are substantially coplanar with, but not overlapping, the upper surface of the uppermost conductive structure 108a. Providing no overlap between the conductive plug structures 110 and the uppermost conductive structure 108a, in combination with providing the low-K dielectric material 114 between horizontally neighboring conductive plug structures 110, may reduce bridging and/or parasitic capacitance between the conductive lines 120 and the uppermost conductive structure 108a and between the conductive plug structures 110 and the uppermost conductive structure 108a by up to 25%, such as between about 12% and about 25%. Providing an increased margin (e.g., 20 nm) of the underlap region 144 of the conductive plug structures 110 relative to the uppermost conductive structure 108a, in combination with providing the low-K dielectric material 114, may reduce bridging and/or parasitic capacitance by up to 30%, such as between about 15% and about 30%.

With reference to FIG. 1F, the conductive plug structures 110 may extend relatively farther within the upper portions of the pillar structures 104, compared to the embodiment of FIG. 1E, such that lower portions of the conductive plug structures 110 are located laterally adjacent to an upper portion of the uppermost conductive structure 108a. The conductive plug structures 110 include a so-called "positive offset" relative to the uppermost conductive structure 108a. As shown in FIG. 1F, an overlap region 146 is defined on an upper end by a plane of the upper surface of the uppermost conductive structure 108a and on a lower end by a plane of the lower surfaces 110b of the conductive plug structures 110. In the embodiment of FIG. 1F, the lower portions of the conductive plug structures 110 at least partially (e.g., substantially) vertically overlap the upper portion the uppermost conductive structure 108a. The lower surfaces 110b of the conductive plug structures 110 extend beyond the upper surface of the uppermost conductive structure 108a, such that lower surfaces 110b of the conductive plug structures 110 are substantially non-coplanar (e.g., uneven) with the upper surface of the uppermost conductive structure 108a. In other words, at least a portion of the individual conductive plug structures 110 is located below the plane of the upper surface of the uppermost conductive structures 108a.

In some embodiments, the overlap region 146 extends to a vertical midpoint of the uppermost conductive structure 108a, such that the upper portion (e.g., upper half) of the uppermost conductive structure 108a is laterally adjacent to the conductive plug structures 110 and the lower portion (e.g., lower half) of the uppermost conductive structure 108a is laterally adjacent to upper portions of the fill material 104b of the pillar structures 104. As the overlap region 146 increases, the region 142 may extend lower to be in closer proximity to the uppermost conductive structure 108a. Accordingly, the region 142 of the channel material of cell film 104a may be laterally adjacent to the uppermost conductive structures 108a, in some instances. By way of non-limiting example, a height of the overlap region 146 may be within a range of from about 5 nm and about 50 nm, such between about 5 nm and about 10 nm, between about 10 nm and about 20 nm, between about 20 nm and about 30 nm, between about 30 nm and about 40 nm, or between about 40 nm and about 50 nm. In some embodiments, the height of the overlap region 146 is about 20 nm. Providing the overlap region 146 of the conductive plug structures 110 relative to the uppermost conductive structure 108a may facilitate an increased current, a so-called "string current," during operations of a microelectronic device (e.g., a memory device) to effectively operate all the memory cells in the vertical string. However, presence of the low-K dielectric material 114 may mitigate the risk of undesirable bridging and/or parasitic capacitance between the conductive plug structures 110 and the uppermost conductive structure 108a by providing improved structural and insulative properties to facilitate improved performance of the microelectronic device structure 100 during use and operation of a microelectronic device.

One of ordinary skill in the art will appreciate that, in accordance with additional embodiments of the disclosure, the features and feature configurations described above in relation to FIGS. 1A through 1F may be adapted to design needs of different microelectronic devices (e.g., different memory devices). By way of non-limiting example, in accordance with additional embodiments of the disclosure, FIG. 1G shows a simplified partial cross-sectional view of a microelectronic device structure 100' formed to have a different configuration than the microelectronic device structure 100 following the processing stage of FIG. 1D. Throughout the remaining description and the accompanying figures, functionally similar features (e.g., structures, devices) are referred to with similar reference numerals. To avoid repetition, not all features shown in the remaining figures (including FIG. 1G) are described in detail herein.

Rather, unless described otherwise below, a feature designated by a reference numeral of a previously described feature (whether the previously described feature is first described before the present paragraph, or is first described after the present paragraph) will be understood to be substantially similar to the previously described feature.

The microelectronic device structure 100' of FIG. 1G may include the stack structure 102 of the tiers 105 of the insulating structures 106 and the conductive structures 108, including the uppermost conductive structure 108a. The conductive plug structures 110 may be formed in the upper portion of the pillar structures 104 and the low-K dielectric material 114 may extend laterally adjacent to (e.g., between) horizontally neighboring conductive plug structures 110 of the pillar structures 104, as in the previous embodiment of FIG. 1D. The microelectronic device structure 100' may also include the contact structures 116 on or over the conductive plug structures 110 of the pillar structures 104, the interconnect structures 118 on or over the contact structures 116, and the conductive lines 120 on or over the interconnect structures 118. Accordingly, the conductive lines 120 may be in electrical contact with the pillar structures 104 through the interconnect structures 118 and the contact structures 116. The microelectronic device structure 100' may also include the cap material 115 on or over the low-K dielectric material 114, the first dielectric material 122 on or over the cap material 115, and the second dielectric material 124 on or over the first dielectric material 122.

As shown in FIG. 1G, one or more air gaps 132 (e.g., voids, unfilled volumes) may be formed in place of one or more portions of the low-K dielectric material 114. In some embodiments, at least some of the air gaps 132 include a gaseous material (e.g., air, oxygen, nitrogen, argon, helium, or a combination thereof). In other embodiments, the air gaps 132 include a vacuum (e.g., a space entirely void of matter). The low-K dielectric material 114 may be replaced (e.g., substantially replaced) with or, alternatively, supplemented with the air gaps 132. Accordingly, at least some of the air gaps 132 may be laterally interposed between portions of the low-K dielectric material 114 and the conductive plug structures 110. Upper boundaries of the air gaps 132 may be vertically below upper surfaces of the pillar structures 104 and the conductive plug structures 110.

In some embodiments, the cap material 115 is formed on or over (e.g., directly vertically adjacent to) the upper surfaces 114a of the low-K dielectric material 114 following formation of the low-K dielectric material 114 within the openings 112 (FIG. 1B). Thereafter, portions of one or more of the cap material 115 and the low-K dielectric material 114 may be removed to facilitate formation of the air gaps 132. In other embodiments, the cap material 115 is formed on or over (e.g., directly vertically adjacent to) the sacrificial material 107 (FIG. 1A) prior to formation of the low-K dielectric material 114 within the openings 112, as discussed with reference to FIG. 1C. Thereafter, the sacrificial material 107 may be at least partially (e.g., substantially) removed through the slots 126. The low-K dielectric material 114 may then be formed within selected portions of the openings 112 (e.g., proximate the slots 126) without fully filling the openings 112. For example, the low-K dielectric material 114 may be formed within the openings 112 to effectively "pinch off" and close (e.g., seal) the openings 112 immediately adjacent to the slots 126 resulting in formation of the air gaps 132. The low-K dielectric material 114 may be formed to extend between the cap material 115 and the uppermost conductive structure 108a within the openings 112, such that the low-K dielectric material 114 substantially completely vertically fills outermost portions of the openings 112 proximate the slots 126 without entirely filling the openings 112. Formation of the low-K dielectric material 114 results in formation of so-called "bread loafing" regions 113 of the low-K dielectric material 114 within the openings 112. Accordingly, formation of the low-K dielectric material 114 through the slots 126 results in the bread loafing regions 113 being present between the horizontally neighboring conductive plug structures 110 of the pillar structures 104. In other words, process acts may be selected to provide (e.g., facilitate, promote) the bread loafing regions 113 of the low-K dielectric material 114 proximate the slots 126 for formation of the air gaps 132 between the horizontally neighboring conductive plug structures 110 of the pillar structures 104. In other embodiments, other materials (e.g., the insulative material 128 of the slots 126) are formed within the outermost portions of the openings 112 to effectively "pinch off" and close the openings 112 immediately adjacent to the slots 126 to form the air gaps 132. Formation of the other materials may or may not result in bread loafing regions thereof being present between the horizontally neighboring conductive plug structures 110 of the pillar structures 104.

The air gaps 132 may be located distal from the slots 126 and proximate (e.g., directly laterally adjacent) to the pillar structures 104. The air gaps 132 may vertically extend from a location vertically above the uppermost conductive structure 108a and may laterally intervene between and separate portions of the low-K dielectric material 114 from the channel material of cell film 104a of the pillar structures 104. The air gaps 132 may be formed proximate the pillar structures 104 without extending a full lateral extent of the low-K dielectric material 114. The air gaps 132 may be formed directly laterally adjacent to the channel material of cell film 104a of the pillar structures 104. Accordingly, the pillar structures 104 may be substantially surrounded by one or more of the low-K dielectric material 114 and the air gaps 132 at an elevational level of the conductive plug structures 110. The air gaps 132 may be defined by one or more of the low-K dielectric material 114, the cap material 115, the pillar structures 104, and the uppermost conductive structure 108a. A lateral side boundary of the air gaps 132 may be substantially vertically aligned with a lateral side surface of at least some of the uppermost conductive structure 108a proximate the pillar structures 104. In some embodiments, the air gaps 132 are directly laterally adjacent to the oxide material 134 (FIGS. 1E and 1F) of the channel material of cell film 104a of the pillar structures 104 and directly vertically adjacent to the high-k dielectric material 138 (FIGS. 1E and 1F), if present, or the liner material 136 (FIGS. 1E and 1F) of the uppermost conductive structure 108a of the stack structure 102. The low-K dielectric material 114 and the air gaps 132 may be formed prior to or following formation of the conductive structures 108 formed through the replacement gate process. The insulative material 128 may be formed in the slots 126 following formation of the low-K dielectric material 114, the air gaps 132, and the conductive structures 108.

In additional embodiments, the low-K dielectric material 114 is formed without formation of the cap material 115, such that the cap material 115 is not present in the microelectronic device structure 100. In some such embodiments, the first dielectric material 122 may be formed on or over the upper surfaces 114a of the low-K dielectric material 114 and may also define upper vertical boundaries of the air gaps 132. The first dielectric material 122 may also be formed on or over portions of the channel material of cell film 104a and the conductive plug structures 110 of the pillar structures 104. The first dielectric material 122 may effectively seal the air gaps 132. A portion of the first dielectric material 122 may be formed on sidewalls of the channel material of cell film 104a of the pillar structures 104. The air gaps 132 may be laterally adjacent to the conductive plug structures 110 without being laterally adjacent to the contact structures 116. A lower boundary of the air gaps 132 may be at least partially defined by an upper surface of the conductive structures 108 (e.g., the uppermost conductive structure 108a) of the stack structure 102. The air gaps 132 are partially defined by the sidewalls of the channel material of cell film 104a of the pillar structures 104 and of the low-K dielectric material 114.

Elongated portions of the air gaps 132 may extend in the second direction (e.g., the Y-direction) with at least a portion of the air gaps 132 being located directly adjacent to the channel material of cell film 104a of the pillar structures 104. Further, the air gaps 132 may be positioned within horizontal boundaries (e.g., a horizontal area) of at least a portion of the conductive structures 108, including the uppermost conductive structure 108a.

In other embodiments, portions of the first dielectric material 122, for example, are formed adjacent to side surfaces (e.g., sidewalls) of one or more of the channel material of cell film 104a of the pillar structures 104 and the low-K dielectric material 114. The first dielectric material 122 may also contact surfaces of the uppermost conductive structure 108a of the stack structure 102. In other words, portions of the first dielectric material 122 may be formed adjacent to (e.g., laterally adjacent to) the pillar structures 104. Accordingly, at least a portion of the first dielectric material 122 is laterally adjacent the low-K dielectric material 114, in some embodiments. The first dielectric material 122 may be formed of and include at least one dielectric material. In some embodiments, the first dielectric material 122 comprises $SiO_2$. In other embodiments, the first dielectric material 122 is formed of and includes a low-K dielectric material. Further, the material of the first dielectric material 122 may be the same as, or different than, the material of the insulating structures 106 and/or the low-K dielectric material 114. In some embodiments, the air gaps 132 exhibit a substantially rectangular profile in at least one horizontal direction (e.g., the X-direction). In other embodiments, the air gaps 132 exhibit a substantially dish-shaped profile, such as a "V-shaped" profile or a "U-shaped" profile. In yet other embodiments, the air gaps 132 exhibit a substantially tapered (e.g., a frustum, an inverted frustum, a substantially Y-shaped) profile or a so-called "hourglass" (e.g., a concave bow) profile, for example.

In some instances, the air gaps 132 may function as an insulator having a dielectric constant (K) of about 1. Further, the air gaps 132 may improve performance of the microelectronic device structure 100 by providing improved insulative properties laterally adjacent to the pillar structures 104, through decreased dielectric constant relative to the low-K dielectric material 114. The air gaps 132 may further limit capacitance (e.g., parasitic capacitance, stray capacitance) between the uppermost conductive structure 108a and the conductive plug structures 110 of the pillar structures 104, and may reduce cross-talk therebetween. For example, the air gaps 132 may be configured (e.g., sized, shaped) to reduce parasitic (e.g., stray) capacitance between lateral portions of the uppermost conductive structure 108a proximate the pillar structures 104 and the conductive plug structures 110.

The air gaps 132 may be formed to have a desired height $H_3$. By way of non-limiting example, the height $H_3$ of the air gaps 132, may be within a range of from about 20 nm to about 60 nm, such as from about 20 nm to about 30 nm, from about 30 nm to about 40 nm, from about 40 nm to about 50 nm, or from about 50 nm to about 60 nm. The height $H_3$ of the air gaps 132 may be relatively larger than the height of the uppermost conductive structure 108a and relative larger than a combined height of the insulating structures 106 and the uppermost conductive structure 108a of one of the tiers 105.

As described above, forming the microelectronic device structure 100 of the embodiment of FIG. 1D to include the low-K dielectric material 114 or, alternatively, forming the microelectronic device structure 100' of the embodiment of FIG. 1G to include the low-K dielectric material 114 and the air gaps 132 may facilitate improved performance of the microelectronic device structures 100, 100'.

For example, the low-K dielectric material 114 and the air gaps 132, according to embodiments of the disclosure may reduce bridging and/or parasitic capacitance between the conductive lines 120 and the uppermost conductive structure 108a and between the conductive plug structures 110 and the uppermost conductive structure 108a by up to 40%, such as between about 12% and about 40% relative to configurations wherein the low-K dielectric material 114 and the air gaps 132 are not present. The reduced capacitance may, in turn, provide a reduced programming time of between about 3% and about 6%, in some instances. The low-K dielectric material 114 laterally adjacent to the pillar structures 104 may allow for reduced parasitic capacitance between the conductive lines 120 and the uppermost conductive structure 108a and between the conductive plug structures 110 and the uppermost conductive structure 108a, without the need to increase a thickness of such insulating structures. Presence of the air gaps 132 proximate to the pillar structures 104 and laterally adjacent to the low-K dielectric material 114 also allows for reduced parasitic capacitance between the conductive plug structures 110 and the uppermost conductive structure 108a. By lowering parasitic capacitance between the conductive plug structures 110 and the uppermost conductive structure 108a using the air gaps 132, bridging and/or parasitic capacitance of the conductive lines 120 and associated contact structures may be further reduced within the microelectronic device structures 100, 100'. As a result, the RC (product of resistance and capacitance) of the conductive structures may be optimized, which may correlate to an increase in the performance of an apparatus containing the microelectronic device structures 100, 100' by allowing for a reduction in operational speed (e.g., programming time). Furthermore, the methods of the disclosure may reduce or eliminate process acts utilized to form many conventional microelectronic devices that may be used for similar operations as the microelectronic device structures 100, 100'. Accordingly, the microelectronic device structures 100, 100' according to embodiments of the disclosure are formed utilizing fewer process acts than conventional device structures.

In contrast, conventional configurations including an insulative material (e.g., an oxide material) laterally adjacent to pillar structures corresponding to the pillar structures 104 may have a dielectric constant of about 3.7 or greater. Accordingly, a portion of an uppermost conductive structure (e.g., corresponding to the uppermost conductive structure 108) of a conventional configuration may be susceptible to electrical contact (e.g., bridging) with conductive plug structures (e.g., corresponding to the conductive plug structures 110) and/or with conductive lines (e.g., corresponding to the conductive lines 120) during subsequent process acts, as well as during use and operation of the conventional microelectronic devices including such conventional configuration.

In conventional configurations, proximity (e.g., physical proximity, electrical proximity) between the conductive lines (e.g., corresponding to the conductive lines 120) and an uppermost conductive structure (e.g., corresponding to the uppermost conductive structure 108a) of a stack structure may result in a first connection (e.g., bridging) therebetween. Further, proximity between the conductive plug structure (e.g., corresponding to the conductive plug structures 110) and the uppermost conductive structure may result in a second connection therebetween. In conventional configurations, an insulative material utilized instead of the low-K dielectric material 114 and the air gaps 132 may result in inadequate isolation between the uppermost conductive structure and additional conductive materials (e.g., conductive lines, conductive plug structures) without unduly increasing a height of the insulative material. In other words, if materials (e.g., oxide materials) within an underlying stack structure are not of sufficient material composition to provide a barrier against formation of one or more of the first connection and the second connection, then bridging may occur between one or more of the conductive plug structures and the conductive lines and at least some of the conductive structures in an upper tier portion of the stack structure, resulting in unintended connection between conductive plug structures and/or the conductive lines and a respective uppermost conductive structure, for example, which may result in undesirable short circuits during use and operation of a conventional microelectronic device.

Accordingly, in conventional configurations, exposure of conductive plug structures (e.g., corresponding to the conductive plug structures 110) and/or conductive lines (e.g., corresponding to the conductive lines 120) proximate to the uppermost conductive structure (e.g., corresponding to the upper conductive structure 108) may lead to so called "bit line loading" as a result of bridging and/or parasitic capacitance. Such bit line loading may be the result of bridging between horizontally neighboring bit lines, between horizontally neighboring bit line contacts, and between the conductive lines and respective word lines. Unintended connection between the conductive plug structures and a respective uppermost conductive structure may account for a greater portion of the bit line loading. In particular, bridging between the bit lines and ground (e.g., through the word lines) may, in some instances, account for 50% or greater of the total bit line loading. Furthermore, an upper tier portion of the stack structure of a conventional configuration may exhibit an increased height in conventional devices in order to provide sufficient isolation between the conductive plug structures and the conductive lines and the uppermost conductive structure of the stack structure, which may result in requirements for increased area (e.g., increased height requirements) within the stack structure.

The methods of the disclosure, substantially reduce the occurrence of unintended connections between the conductive lines 120 and the uppermost conductive structure 108a and/or between the conductive plug structures 110 and the uppermost conductive structure 108a due to the presence of one or more of the low-K dielectric material 114 and the air gaps 132 between the conductive plug structures 110 of horizontally neighboring pillar structures 104. The increased isolation between the conductive lines 120 and the uppermost conductive structure 108a and/or between the conductive plug structures 110 and the uppermost conductive structure 108a according to embodiments of the disclosure may facilitate circuitry to operate at substantially increased voltages. Further, the methods of the disclosure may be implemented, while offering significantly reduced power demand and physical space requirements, without significant change to process requirements. Accordingly, formation of the low-K dielectric material 114 and the air gaps 132 may reduce various processing complexities (e.g., complexities associated with properly sizing and aligning various contact openings and structures) associated with the formation of conventional contact structures and associated insulative materials for a microelectronic device.

Thus, in accordance with embodiments of the disclosure, a method of forming a microelectronic device comprises forming a stack structure comprising vertically alternating insulating structures and conductive structures arranged in tiers. Each of the tiers individually comprising one of the insulating structures and one of the conductive structures. The method comprises forming a sacrificial material over the stack structure and forming pillar structures extending vertically through the stack structure and the sacrificial material. The method further comprises forming conductive plug structures within upper portions of the pillar structures, forming slots extending vertically through the stack structure and the sacrificial material, at least partially removing the sacrificial material to form openings horizontally interposed between the conductive plug structures, and forming a low-K dielectric material within the openings.

Furthermore, in accordance with additional embodiments of the disclosure, a microelectronic device comprises pillar structures extending vertically through a stack structure of vertically alternating insulating structures and conductive structures arranged in tiers. Each of the tiers individually comprising one of the insulating structures and one of the conductive structures. The microelectronic device comprises conductive lines over the stack structure and coupled to the pillar structures, and conductive plug structures within upper portions of the pillar structures. The conductive plug structures are coupled to the conductive lines and the pillar structures. The microelectronic device further comprises a low-K dielectric material horizontally interposed between at least two conductive plug structures horizontally neighboring one another.

Figure 2:
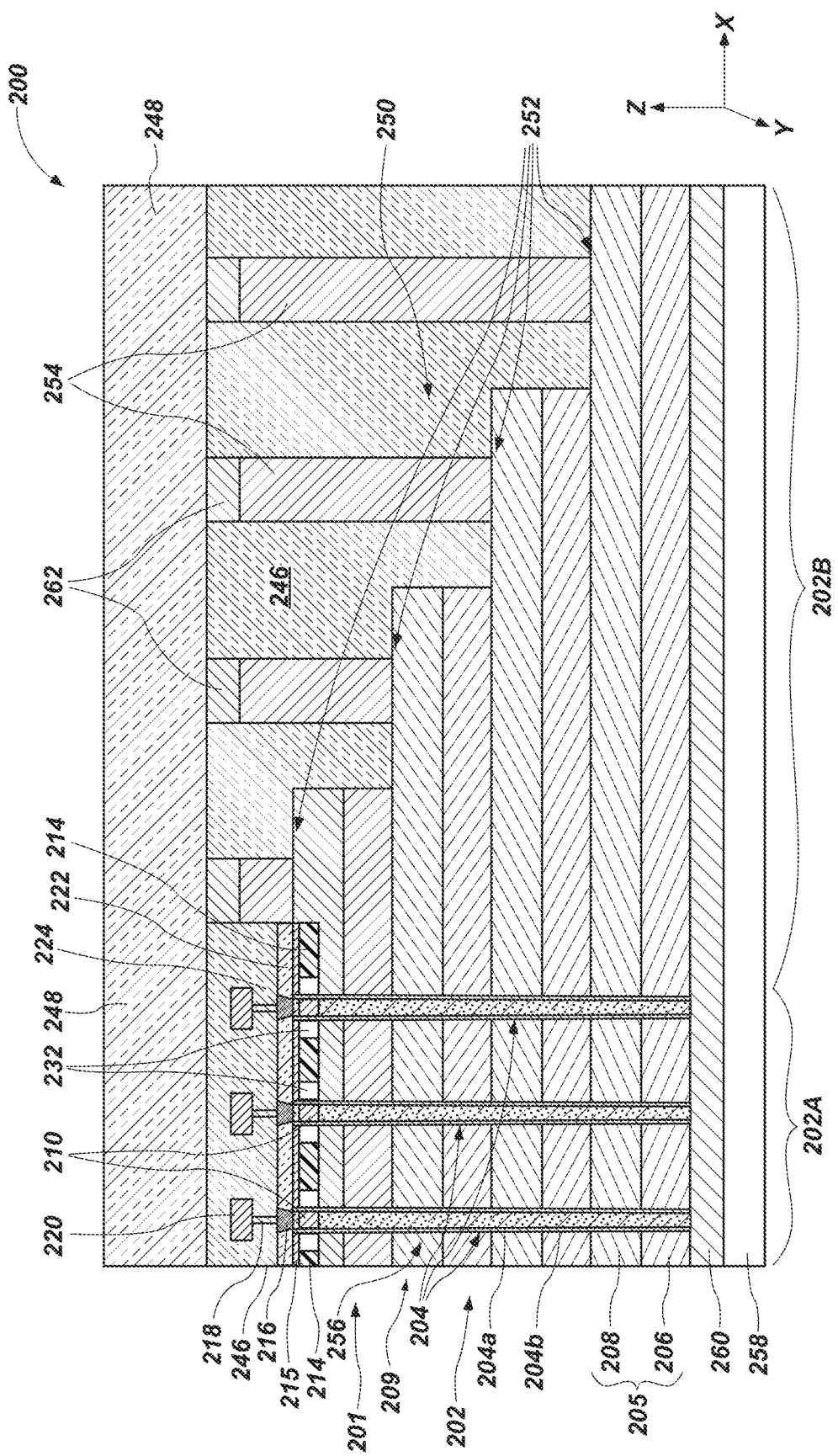
FIG. 2 is a simplified partial cross-sectional view of a microelectronic device formed through the method described with reference to FIGS. 1A through 1G, in accordance with embodiments of the disclosure.

Microelectronic device structures (e.g., the microelectronic device structures 100, 100' following the processing previously described with reference to FIGS. 1A through 1G) according to embodiments of the disclosure may be included in microelectronic devices (e.g., memory devices, such as 3D NAND Flash memory devices). For example, FIG. 2 illustrates a simplified partial cross-sectional view of a microelectronic device 201 including a microelectronic device structure 200. The microelectronic device structure 200 may be substantially similar to one of the microelectronic device structures 100, 100' following processing previously described with reference to FIGS. 1A through 1G. Throughout FIG. 2 and the associated description below, features (e.g., structures, materials, regions) functionally similar to features of the microelectronic device structures 100, 100' previously described with reference to one or more of FIGS. 1A through 1G are referred to with similar reference numerals incremented by 100. To avoid repetition, not all features shown in FIG. 2 are described in detail herein. Rather, unless described otherwise below, in FIG. 2, a feature designated by a reference numeral that is a 100 increment of the reference numeral of a feature previously described with reference to one or more of FIGS. 1A through 1G will be understood to be substantially similar to and formed in substantially the same manner as the previously described feature.

As shown in FIG. 2, the microelectronic device structure 200 (including the components thereof previously described with reference to one or more of FIGS. 1A through 1G) of the microelectronic device 201 may be operably associated with a stack structure 202 of the microelectronic device 201. The stack structure 202 may correspond to the stack structure 102, previously described herein with reference to FIG. 1A. The stack structure 202 includes a vertically alternating (e.g., in the Z-direction) sequence of conductive structures 208 (e.g., access lines, word lines) and insulative structures 206 arranged in tiers 205. The tiers 205, including the conductive structures 208 and the insulative structures 206, may correspond to the tiers 105, including the conductive structures 108 and the insulating structures 106. In addition, as shown in FIG. 2, the stack structure 202 includes a memory array region 202A, and a staircase region 202B horizontally neighboring (e.g., in the X-direction) the memory array region 202A. As described in further detail below, the microelectronic device 201 further includes additional components (e.g., features, structures, devices) within horizontal boundaries of the different regions (e.g., the memory array region 202A and the staircase region 202B) of the stack structure 202.

The tiers 205 of the stack structure 202 of the microelectronic device 201 may each individually include at least one of the conductive structures 208 vertically neighboring at least one of the insulative structures 206. The stack structure 202 may include a desired quantity of the tiers 205. For example, the stack structure 202 may include greater than or equal to eight (8) of the tiers 205, greater than or equal to sixteen (16) of the tiers 205, greater than or equal to thirty-two (32) of the tiers 205, greater than or equal to sixty-four (64) of the tiers 205, greater than or equal to one hundred and twenty-eight (128) of the tiers 205, or greater than or equal to two hundred and fifty-six (256) of the tiers 205 of the conductive structures 208 and the insulative structures 206.

The conductive structures 208 of the tiers 205 of the stack structure 202 may be formed of and include at least one conductive material. In some embodiments, the conductive structures 208 are formed of and include W. In other embodiments, the conductive structures 208 are formed of and include conductively doped polysilicon. Each of the conductive structures 208 may individually be substantially homogeneous, or one or more of the conductive structures 208 may individually be substantially heterogeneous. In some embodiments, each of the conductive structures 208 of the stack structure 202 is substantially homogeneous. In additional embodiments, at least one (e.g., each) of the conductive structures 208 of the stack structure 202 is heterogeneous. An individual conductive structure 208 may, for example, be formed of and include a stack of at least two different electrically conductive materials. The conductive structures 208 of each of the tiers 205 of the stack structure 202 may each be substantially planar, and may each exhibit a desired thickness.

The insulative structures 206 of the tiers 205 of the stack structure 202 may be formed of and include at least one insulative material. In some embodiments, the insulative structures 206 are formed of and include $SiO_2$. Each of the insulative structures 206 may individually be substantially homogeneous, or one or more of the insulative structures 206 may individually be substantially heterogeneous. In some embodiments, each of the insulative structures 206 of the stack structure 202 is substantially homogeneous. In additional embodiments, at least one (e.g., each) of the insulative structures 206 of the stack structure 202 is heterogeneous. An individual insulative structures 206 may, for example, be formed of and include a stack of at least two different dielectric materials. The insulative structures 206 of each of the tiers 205 of the stack structure 202 may each be substantially planar, and may each individually exhibit a desired thickness.

At least one lower conductive structure 208 of the stack structure 202 may be employed as at least one lower select gate (e.g., at least one source side select gate (SGS)) of the microelectronic device 201. In some embodiments, a single (e.g., only one) conductive structure 208 of a vertically lowermost tier 205 of the stack structure 202 is employed as a lower select gate (e.g., a SGS) of the microelectronic device 201. In some embodiments, upper conductive structure(s) 208 of the stack structure 202 may be employed as select gate structures 209 (e.g., drain side select gate(s) (SGDs)) of the microelectronic device 201. The select gate structures 209 may correspond to the select gate structures 109. In some embodiments, horizontally neighboring (e.g., in the Y-direction) conductive structures 208 of a vertically uppermost tier 205 of the stack structure 202 are employed as upper select gates (e.g., SGDs) of the microelectronic device 201. In yet other embodiments, upper select gates of the microelectronic device 201 may be located vertically above the stack structure 202 (e.g., within an additional stack structure of a multi-stack device) overlying the stack structure 202.

Still referring to FIG. 2, within horizontal boundaries (e.g., in the X-direction and the Y-direction) of the memory array region 202A of the stack structure 202, the microelectronic device 201 may include pillar structures 204 vertically extending through the stack structure 202. As shown in FIG. 2, the pillar structures 204 may be formed to vertically extend substantially completely through the stack structure 202. The pillar structures 204, including a channel material of cell film 204a surrounding a fill material 204b, may correspond to the pillar structures 104, including the channel material of cell film 104a surrounding the fill material 104b, previously described herein with reference to FIG. 1A. Conductive plug structures 210 (e.g., a drain contact plug material) may be formed within upper portions of the pillar structures 204. A low-K dielectric material 214 may laterally intervene between and separate the conductive plug structures 210 of the pillar structures 204 from one another. The conductive plug structures 210 and the low-K dielectric material 214 may correspond to the conductive plug structures 110 and the low-K dielectric material 114, respectively.

The microelectronic device structure 200 may be formed to include a desired quantity (e.g., number, amount) of the pillar structures 204. While FIG. 2 depicts the microelectronic device structure 200 as being formed to include three (3) of the pillar structures 204, the microelectronic device structure 200 may be formed to include more than three (3) (e.g., greater than or equal to eight (8), greater than or equal to sixteen (16), greater than or equal to thirty-two (32), greater than or equal to sixty-four (64), greater than or equal to one hundred and twenty-eight (128), greater than or equal to two hundred and fifty-six (256)) of the pillar structures 204. Intersections of the pillar structures 204 and the conductive structures 208 of the tiers 205 of the stack structure 202 may define vertically extending strings of memory cells 256 coupled in series with one another within the memory array region 202A of the stack structure 202. In some embodiments, the memory cells 256 formed at the intersections of the conductive structures 208 and the pillar structures 204 within each the tiers 205 of the stack structure 202 comprise so-called "MONOS" (metal-oxide-nitride-oxide-semiconductor) memory cells. In additional embodiments, the memory cells 256 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 256 comprise so-called "floating gate" memory cells including floating gates (e.g., metallic floating gates) as charge storage structures. The floating gates may horizontally intervene between central structures of the pillar structures 204 and the conductive structures 208 of the different tiers 205 of the stack structure 202. The microelectronic device 201 may include any desired quantity and distribution of the pillar structures 204 within the memory array region 202A of the stack structure 202.

The microelectronic device 201 may further include conductive lines 220 (e.g., digit lines, data lines, bit lines) vertically overlying the stack structure 202, at least one source structure 260 (e.g., source line, source plate) vertically underlying the stack structure 202, and at least one control device 258 vertically underlying the source structure 260. The conductive lines 220 may correspond to the conductive lines 120 previously described with reference to FIG. 1D. Contact structures 216 may be located on or over uppermost surfaces of the conductive plug structures 210 within upper portions of the pillar structures 204 and interconnect structures 218 may be located on or over uppermost surfaces of the contact structures 216. The contact structures 216 and the interconnect structures 218 may correspond to the contact structures 116 and the interconnect structures 118, respectively, previously described herein with reference to FIG. 1D. The microelectronic device 201 may include a first dielectric material 222 horizontally adjacent to the contact structures 216 and a second dielectric material 224 horizontally adjacent to the interconnect structures 218. The first dielectric material 222 and the second dielectric material 224 may correspond to the first dielectric material 122 and the second dielectric material 124, respectively, previously described herein with reference to FIG. 1D. The pillar structures 204 may vertically extend between (e.g., in the Z-direction) the conductive lines 220 and the source structure 260. The source structure 260 may vertically extend between the stack structure 202 and the control device 258. The conductive lines 220 and the source structure 260 may each individually be formed of and include at least one conductive material. The microelectronic device 201 may further include air gaps 232 horizontally adjacent to the conductive plug structures 210 of the pillar structures 204 and a cap material 215 overlying the low-K dielectric material 214 and the air gaps 232. The air gaps 232 may correspond to the air gaps 132 previously described with reference to FIG. 1G and the cap material 215 may correspond to the cap material 115 previously described with reference to FIG. 1C.

With continued reference to FIG. 2, the control device 258 may include devices and circuitry for controlling various operations of other components of the microelectronic device structure 200. By way of non-limiting example, the control device 258 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the microelectronic device structure 200, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the microelectronic device structure 200, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control device 258 includes CMOS (complementary metal-oxide-semiconductor) circuitry. In such embodiments, the control device 258 may be characterized as having a "CMOS under Array" ("CuA") configuration.

Within horizontal boundaries of the staircase region 202B of the stack structure 202, the stack structure 202 may include at least one staircase structure 250. The staircase structure 250 includes steps 252 at least partially defined by horizontal ends (e.g., in the X-direction) of the tiers 205. The steps 252 of the staircase structure 250 may serve as contact regions to electrically couple the conductive structures 208 of the tiers 205 of the stack structure 202 to other components (e.g., features, structures, devices) of the microelectronic device 201, as described in further detail below. The staircase structure 250 may include a desired quantity of steps 252. In addition, as shown in FIG. 2, in some embodiments, the steps 252 of each of the staircase structure 250 are arranged in order, such that steps 252 directly horizontally adjacent (e.g., in the X-direction) one another correspond to tiers 205 of the stack structure 202 directly vertically adjacent (e.g., in the Z-direction) one another. In additional embodiments, the steps 252 of the staircase structure 250 are arranged out of order, such that at least some steps 252 of the staircase structure 250 directly horizontally adjacent (e.g., in the X-direction) one another correspond to tiers 205 of stack structure 202 not directly vertically adjacent (e.g., in the Z-direction) one another.

Still referring to FIG. 2, the microelectronic device 201 may further include lower conductive structures 254 (e.g., conductive contact structures, such as word line contact structures) physically and electrically contacting at least some (e.g., each) of the steps 252 of the staircase structure 250 of the stack structure 202 to provide electrical access to the conductive structures 208 of the stack structure 202. The lower conductive structures 254 may be coupled to the conductive structures 208 of the tiers 205 of the stack structure 202 at the steps 252 of the staircase structure 250. As shown in FIG. 2, the lower conductive structures 254 may physically contact and upwardly vertically extend (e.g., in the positive Z-direction) from the conductive structures 208 at the steps 252 of the staircase structure 250 to lower contact structures 262 of additional structures (e.g., access devices, vertical transistors) that may be on or over the lower contact structures 262.

The microelectronic device 201 may further include a first isolation material 246 on or over the stack structure 202 and a second isolation material 248 on or over the first isolation material 246. As shown in FIG. 2, the first isolation material 246 may be vertically interposed (e.g., in the Z-direction) between the stack structure 202 and the second isolation material 248. The first isolation material 246 may substantially cover the staircase structure 250 within the staircase region 202B of the stack structure 202, and may substantially surround side surfaces (e.g., sidewalls) of the lower conductive structures 254 on the steps 252 of the staircase structure 250. The first isolation material 246 may exhibit a substantially planar upper vertical boundary, and a substantially non-planar lower vertical boundary complementary to the topography of at least the stack structure 202 (including the staircase structure 250 thereof) thereunder. The second isolation material 248 may be formed on or over the conductive lines 220 within the memory array region 202A of the stack structure 202.

Thus, in accordance with additional embodiments of the disclosure, a memory device comprises access lines extending in a first horizontal direction, data lines extending in a second horizontal direction orthogonal to the first horizontal direction, and memory cells proximate intersections of the access lines and the data lines. The memory device comprises interconnect structures vertically between and in electrical communication with the data lines and the memory cells, contact structures vertically between and in electrical communication with the interconnect structures and the memory cells, and conductive plug structures vertically between and in electrical communication with the contact structures and the memory cells. The conductive plug structures are horizontally separated from one another by a low-K dielectric material and at least one air gap.

Figure 3:
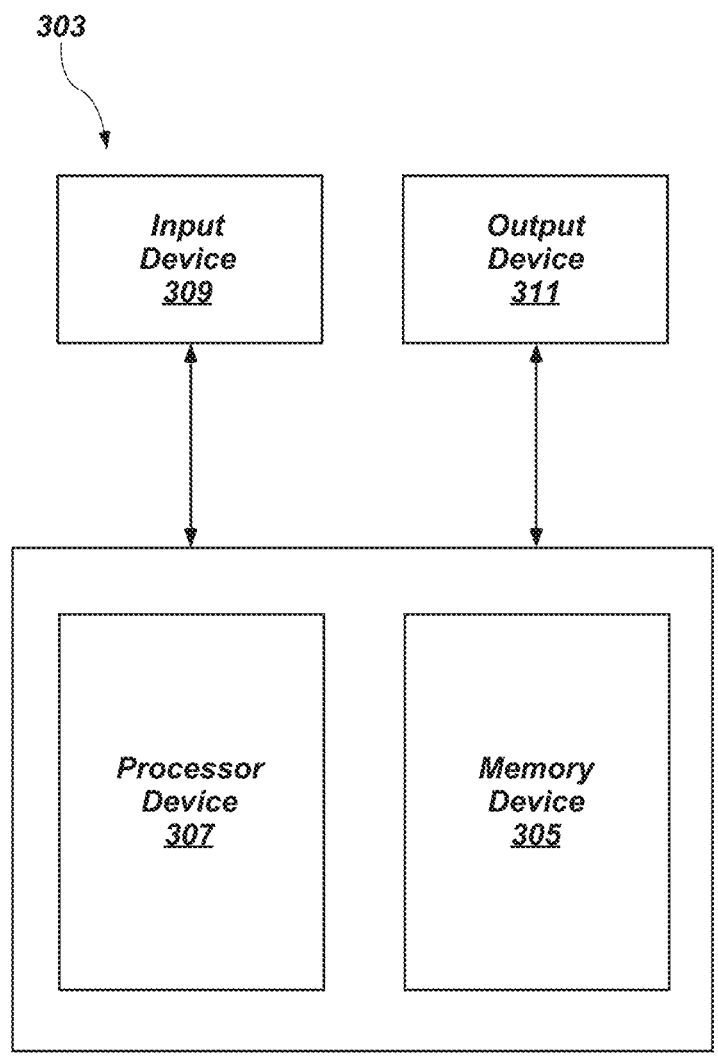
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 100', 200) including the low-K dielectric material 114, or alternatively, the low-K dielectric material 114 in combination with the air gaps 132 between horizontally neighboring pillar structures 104, in according embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structures 100, 100', 200) or a microelectronic device (e.g., the microelectronic device 201) previously described with reference to FIGS. 1A through 1G and FIG. 2 including the low-K dielectric material 114 and the air gaps 132.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structures 100, 100', 200 previously described with reference to FIGS. 1A through 1G and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
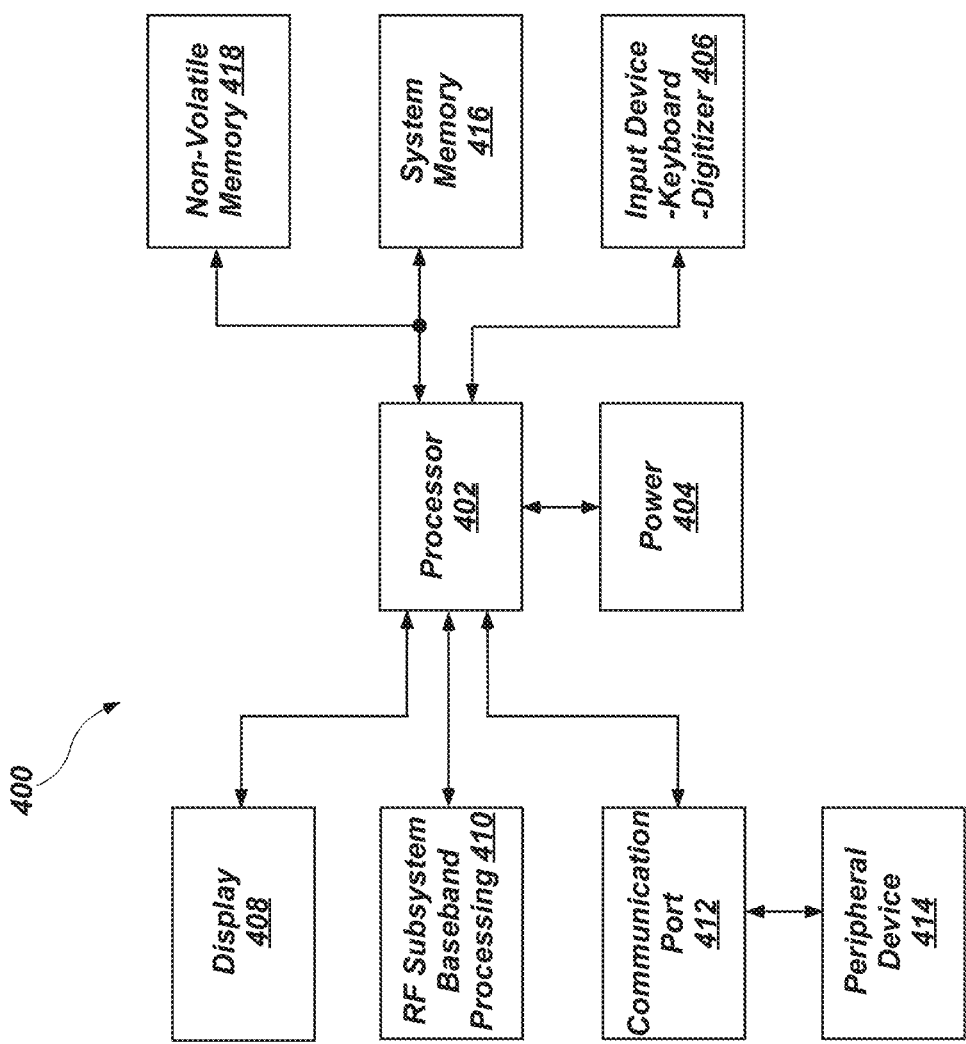
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structures 100, 100', 200) manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structures 100, 100', 200) manufactured in accordance with embodiments of the disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structures 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structures 100, 100', 200) described above, or a combination thereof.

Accordingly, in at least some embodiments, an electronic system comprises a processor, and a memory device operably coupled to the processor device and comprising at least one microelectronic device. The at least one microelectronic device comprises vertical structures extending through a stack of alternating conductive materials and dielectric materials. Each of the vertical structures comprises a channel structure laterally adjacent to and substantially surrounding an insulative material, and a conductive plug structure adjacent to the channel structure. The at least one microelectronic device comprises an uppermost conductive gate structure laterally adjacent to the vertical structures, a low-K dielectric material laterally separating the vertical structures from one another at an elevational level of the conductive plug structure, and air gaps laterally between the conductive plug structure and the low-K dielectric material. A lower surface of the conductive plug structure is located at or above a plane of an upper surface of the uppermost conductive gate structure.

The microelectronic device structures, devices, and systems of the disclosure advantageously facilitate one or more of improved simplicity, greater packaging density, and increased miniaturization of components as compared to conventional structures, conventional devices, and conventional systems. The methods and structures of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, comprising:
    forming a stack structure comprising vertically alternating insulating structures and conductive structures arranged in tiers, each of the tiers individually comprising one of the insulating structures and one of the conductive structures;
    forming a sacrificial material over the stack structure;
    forming pillar structures extending vertically through the stack structure and the sacrificial material;
    forming conductive plug structures within upper portions of the pillar structures;
    forming slots extending vertically through the stack structure and the sacrificial material;
    at least partially removing the sacrificial material to form openings horizontally interposed between the conductive plug structures; and
    forming a low-K dielectric material within the openings.

2. The method of claim 1, further comprising forming a cap material above exposed surfaces of the sacrificial material prior to at least partially removing the sacrificial material.

3. The method of claim 1, wherein forming the low-K dielectric material comprises forming the low-K dielectric material to substantially extend between laterally neighboring pillar structures and to substantially surround individual pillar structures at an elevational level of the conductive plug structures.

4. The method of claim 1, further comprising selecting the low-K dielectric material to comprise one or more of $SiO_xC_y$, $SiO_xN_y$, $SiC_xO_yH_z$, and $SiO_xC_yN_z$.

5. The method of claim 1, further comprising forming air gaps laterally adjacent to the low-K dielectric material and within horizontal boundaries of at least some of the conductive structures of the stack structure.

6. The method of claim 5, wherein forming the air gaps comprises forming bread loafing regions of the low-K dielectric material proximate to the slots to seal the openings.

7. The method of claim 1, further comprising:
    forming conductive lines over the stack structure and operably coupled to the pillar structures;
    forming interconnect structures coupled to the conductive lines; and forming contact structures between the interconnect structures and the conductive plug structures.

8. The method of claim 1, wherein forming the conductive plug structures comprises positioning lowermost surfaces of the conductive plug structures at an elevational plane above an upper surface of an uppermost conductive structure of the stack structure.

9. The method of claim 1, wherein forming the stack structure comprises forming a high-k dielectric material between vertically adjacent insulative structures and forming a conductive liner material between the high-k dielectric material and the conductive structures, the low-K dielectric material directly physically contacting one or more of the high-k dielectric material and the conductive liner material.

10. A microelectronic device, comprising:
pillar structures extending vertically through a stack structure of vertically alternating insulating structures and conductive structures arranged in tiers individually comprising one of the insulating structures and one of the conductive structures, the pillar structures individually comprising:
a channel material; and
a block oxide material;
conductive lines over the stack structure and coupled to the pillar structures;
conductive plug structures within upper portions of the pillar structures and directly laterally adjacent to the channel material, the conductive plug structures coupled to the conductive lines and the pillar structures; and
a low-K dielectric material horizontally interposed between at least two conductive plug structures horizontally neighboring one another, the block oxide material of the pillar structures located directly between the channel material of the pillar structures and the low-K dielectric material.

11. The microelectronic device of claim 10, further comprising nitride structures horizontally between the pillar structures and directly vertically overlying the low-K dielectric material.

12. The microelectronic device of claim 10, further comprising air gaps laterally between the at least two conductive plug structures, the air gaps separating the low-K dielectric material from the pillar structures and within direct vertical alignment with at least a portion of the conductive lines.

13. The microelectronic device of claim 12, further comprising an insulative material within slots extending vertically through the stack structure, wherein the air gaps are isolated from the insulative material and horizontally adjacent to the pillar structures.

14. The microelectronic device of claim 10, wherein the conductive plug structures and the channel material comprise an n-type dopant, the conductive plug structures having a greater concentration of the n-type dopant than the channel material.

15. The microelectronic device of claim 10, wherein upper surfaces of each of the conductive plug structures, the channel material, and the block oxide material are substantially coplanar with one another.

16. The microelectronic device of claim 10, wherein the conductive plug structures are laterally adjacent to the channel material of the pillar structures along a vertical extent of the conductive plug structures, without being laterally adjacent to an uppermost conductive structure of the stack structure.

17. A memory device, comprising:
access lines extending in a first horizontal direction, at least some of the access lines configured as select gate structures;
data lines extending in a second horizontal direction orthogonal to the first horizontal direction;
memory cells proximate intersections of the access lines and the data lines;
interconnect structures vertically between and in electrical communication with the data lines and the memory cells;
contact structures vertically between and in electrical communication with the interconnect structures and the memory cells; and
conductive plug structures vertically between and in electrical communication with the contact structures and the memory cells, the conductive plug structures horizontally separated from one another by a low-K dielectric material and at least one air gap, a lateral side boundary of the at least one air gap substantially vertically aligned with a lateral side surface of at least some of the select gate structures.

18. The memory device of claim 17, wherein the at least one air gap is within horizontal boundaries of the access lines and is within vertical boundaries of the conductive plug structures.

19. The memory device of claim 17, further comprising:
a first dielectric material horizontally adjacent to the contact structures;
a second dielectric material horizontally adjacent to the interconnect structures; and
a nitride cap material directly between the first dielectric material and the low-K dielectric material.

20. The memory device of claim 17, wherein the low-K dielectric material has a dielectric constant of within a range of from about 1.9 to about 3.2 and a height within a range of from about 30 nm to about 40 nm.

21. An electronic system, comprising:
a processor; and
a memory device operably coupled to the processor and comprising at least one microelectronic device, the at least one microelectronic device comprising:
vertical structures extending through a stack of alternating conductive materials and dielectric materials, each of the vertical structures comprising:
a channel structure laterally adjacent to and substantially surrounding an insulative material; and
a conductive plug structure directly laterally adjacent to the channel structure, upper surfaces of the conductive plug structure and the channel structure substantially coplanar with one another;
an uppermost conductive gate structure laterally adjacent to the vertical structures, a lower surface of the conductive plug structure located at or above a plane of an upper surface of the uppermost conductive gate structure;
a low-K dielectric material laterally separating the vertical structures from one another at an elevational level of the conductive plug structure; and
air gaps laterally between the conductive plug structure and the low-K dielectric material.

22. The electronic system of claim 21, further comprising a nitride material vertically overlying the low-K dielectric material and the air gaps, the air gaps at least partially defined by the nitride material and the low-K dielectric material.

23. The electronic system of claim 21, wherein the memory device comprises a 3D NAND Flash memory device.

\* \* \* \* \*